United States Patent

Amano et al.

[11] Patent Number: 5,894,448
[45] Date of Patent: Apr. 13, 1999

[54] SEMICONDUCTOR MEMORY DEVICE HAVING HIERARCHY CONTROL CIRCUIT ARCHITECTURE OF MASTER/LOCAL CONTROL CIRCUITS PERMITTING HIGH SPEED ACCESSING

[75] Inventors: Teruhiko Amano; Masaki Tsukude, both of Hyogo, Japan

[73] Assignee: Mitsubishi Denki Kabushiki Kaisha, Tokyo, Japan

[21] Appl. No.: 08/944,642

[22] Filed: Oct. 6, 1997

[30] Foreign Application Priority Data

Mar. 24, 1997 [JP] Japan .................. 9-070296

[51] Int. Cl.[6] .................................. G11C 8/00
[52] U.S. Cl. .............. 365/230.08; 365/63; 365/230.03
[58] Field of Search .................. 365/230.03, 230.06, 365/230.08, 63

[56] References Cited

U.S. PATENT DOCUMENTS

| | | | |
|---|---|---|---|
| 5,422,856 | 6/1995 | Sasaki et al. | 365/230.03 |
| 5,477,488 | 12/1995 | Subramani | 365/230.03 |
| 5,493,535 | 2/1996 | Cho | 365/230.03 |
| 5,497,349 | 3/1996 | Nakai et al. | 365/230.03 |
| 5,627,792 | 5/1997 | Tsujimoto | 365/230.03 |
| 5,629,903 | 5/1997 | Agata | 365/230.06 |

FOREIGN PATENT DOCUMENTS 2-5292  1/1990  Japan .
7-45795  2/1995  Japan .

Primary Examiner—Son T. Dinh
Attorney, Agent, or Firm—McDermott, Will & Emery

[57] ABSTRACT

Memory mats provided in four regions formed by dividing a semiconductor chip are each further divided into a plurality of memory arrays along the longer side direction of the chip, row related circuits are provided between the memory arrays along the shorter side direction of the chip, and column decoders are provided along the longer side direction of the chip. An internal control signal from a master control circuit in the central part of the chip is transmitted in the central region with respect to the shorter side direction of the chip, buffer circuits are provided to an internal control signal transmission bus, and an internal signal is transmitted to the row related circuit and the column decoder by the buffer circuit. The length of the signal line to drive is shortened, and therefore the signal can be transmitted at a high speed, thus enabling high speed accessing. Thus, signal propagation delay can be reduced even if the chip size increases.

20 Claims, 12 Drawing Sheets

SEMICONDUCTOR MEMORY DEVICE HAVING HIERARCHY CONTROL CIRCUIT ARCHITECTURE OF MASTER/LOCAL CONTROL CIRCUITS PERMITTING HIGH SPEED ACCESSING

BACKGROUND OF THE INVENTION

1. Field of the Invention

The present invention relates generally to semiconductor memory devices, and more particularly to the arrangement of peripheral circuits in a semiconductor memory device. More particularly, the present invention relates to the arrangement of peripheral circuits for achieving high speed accessing to a Dynamic Random Access Memory.

2. Description of the Background Art

FIG. 9 is a diagram schematically showing the configuration of a memory mat in a conventional semiconductor memory device. In FIG. 9, memory mat MM is divided into a plurality of memory blocks MB#0 to MB#m each having a plurality of memory cells arranged in rows and columns. Between these memory blocks MB#0 to MB#m arranged are sense amplifier bands SB#1 to SB#m each of which detects and amplifies data on columns in a corresponding memory block when activated, and further provided outside memory blocks MB#0 and MB#m are sense amplifier bands SB#0 and SB#n, respectively. More specifically, sense amplifier band SB#1 is shared between memory blocks MB#0 and MB#1 on its both sides, and sense amplifier band SB#m is shared between memory blocks MB#m and MB#m-1 (not shown). A configuration having these sense amplifier bands SB (generally representing sense amplifier bands SB#1 to SB#m) between facing memory blocks is known as "shared sense amplifier configuration", in which a selected memory block (a block including a selected memory cell) is connected to a corresponding sense amplifier band, a non-selected memory block, the other of the paired memory blocks is electrically separated from the corresponding sense amplifier band. If the memory blocks on both sides of the sense amplifier band are both non-selected memory blocks (which include no selected memory cell), these memory blocks are connected to the sense amplifier band to keep their precharged states.

A row related circuit RRC for performing an operation related to selecting a row of memory cells is provided along a longer side of the memory mat MM, and a column decoder CD is provided adjacent to sense amplifier band SB#n. Row related circuit RRC include row decode circuits provided corresponding to memory blocks MB#0 to MB#m. The row decode circuit drives into a selected state a word line WL corresponding to a memory cell row addressed in response to an address signal applied through a path not shown. In FIG. 9, a single word line WL is shown in memory block MB#1 by way of illustration Word line WL is provided only in one memory block and along the direction of a shorter side of memory mat MM.

Meanwhile, column decoder CD decodes an address signal (not shown), and produces a column select signal to select an addressed column. The column select signal from column decoder CD is transferred onto a column select signal transmission line CSL. Column select signal transmission line CSL is provided extending along the longer side direction of memory mat MM and over all the memory blocks MB#0 to MB#m so as to be shared among all the memory blocks MB#0 to MB#m.

In the configuration of memory mat MM in FIG. 9, a prescribed number of memory blocks, one or two memory blocks for example, out of memory blocks MB#0 to MB#m are driven into a selected state, and data are written/read to/from the selected memory blocks. Thus, all the memory blocks MB#0 to MB#m are not activated, but only a prescribed number of memory blocks are activated to reduce current consumption.

FIG. 10 is a diagram schematically showing one memory block and sense amplifier bands on its both sides in the memory mat shown in FIG. 9. In FIG. 10, the configuration of memory block MB#i is schematically shown.

In FIG. 10, memory block MB#i includes a plurality of memory cells MC arranged in rows and columns, a plurality of word lines WL0 to WLn each having memory cells MC in a corresponding row connected thereto, and a plurality of bit line pairs BLP provided corresponding to respective columns of memory cells MC and each having memory cells MC in a corresponding column connected thereto. In FIG. 10, three bit line pairs BLP0, BLP1 and BLP2 are shown by way of illustration. Bit line pairs BLP0 to BLP2 each include bit lines BL and /BL which transfer data signals complimentary with each other. Memory cells MC are provided corresponding to crossings of word lines WL (generally representing WL0 to WLn) and bit lines BL and /BL.

Sense amplifier band SB#i provided between memory blocks MB#i-1 and MB#i includes a sense amplifier SAaj+1 provided corresponding to an odd-numbered bit line pair BLPj+1 of these memory blocks MB#i-1 and MB#i. In FIG. 10, sense amplifier SAa1 provided corresponding to bit line pair BLP1 is shown by way of illustration. Adjacent to sense amplifier SAa1, a bit line equalize circuit EQ for equalizing a corresponding pair of bit lines to a prescribed intermediate potential VBL when activated is provided. The equalize circuit is also represented by equalize circuit EQa1 adjacent to sense amplifier SAa1 by way of illustration in FIG. 10.

A sense amplifier (SAa1) in sense amplifier band SB#i is connected to an odd-numbered bit line pair (BLP1) in memory block MB#i-1 through a bit line isolation gate IGca which conducts in response to a bit line isolation control signal BLIa0, and is electrically connected to an odd-numbered bit line pair (BLP1) in memory block MB#i through a bit line isolation gate IGaa (IGaa1) which conducts in response to a bit line isolation control signal BLIa1.

Sense amplifier band SB#i+1 includes sense amplifiers SAb (SAb0, SAb2 . . . ) provided corresponding to even-numbered bit line pairs (BLP0, BLP2, . . . ) in memory block MB#i and MB#i+1 which is not shown.

Sense amplifier band SBi+1 further includes bit line equalize circuits EQb (EQb0, EQb1, . . . ) provided adjacent to sense amplifiers SAb (SAb0, SAb2, . . . ) to precharge and equalize a corresponding bit line pair BLP (BLP0, BLP2, . . . ) into an intermediate potential level.

Sense amplifiers SAb (SAb0, SAb2, . . . ) in sense amplifier band SB#1+1 are electrically connected to even-numbered bit line pairs BLP (BLP0, BLP2, . . . ) in a corresponding memory block MB#i through bit line isolation gates IGab (IGab0, IGab2, . . . ) which conduct in response to a bit line isolation control signal BLIb.

Sense amplifiers SAb (SAb0, SAb1, . . . ) in sense amplifier band SB#i+1 are also electrically connected to even-numbered bit line pairs in memory block MB#i+1 which is not shown through corresponding bit line isolation gates.

Row related circuit RRC corresponding to memory block MB#i includes a row decode circuit RD which decodes an internal address signal (which includes an address to designate a memory block) and produces a signal to select a word line corresponding to a row addressed in memory block MB#i, and word line drive circuits WD0 to WDn provided corresponding to word lines WL0 to WLn, respectively to drive a corresponding word line into a selected state in response to a row select signal from row decode circuit RD.

Row related circuit RRC further includes a bit line isolation control circuit BIGa0 which outputs bit line isolation control signal BLIa0 from its output driver Da in response to a memory block address signal which is not shown and a timing signal, a sense amplifier control circuit SACa which activates and applies a sense amplifier activation signal SOa from its output driver Db to each sense amplifier SAa (SAa1, ...) in response to a memory block address signal and the sense amplifier activation signal, an equalize control circuit EQCa which applies an equalize instruction signal φEQa to equalize circuit EQa (EQa1, ...) included in sense amplifier band SB#i through its output driver Dc in response to a memory block address signal and a timing signal, and a bit line isolation control circuit BIGa1 which outputs bit line isolation control signal BLIa1 from its output driver Dd for application to a bit line isolation gate IGaa (IGaa1, ...) in response to a memory block address signal and a timing signal.

Row related circuit RRC further includes a bit line isolation control circuit BIGb which outputs bit line isolation control signal BLIb from its output driver De for application to bit line isolation gate IGab (IGab0, IGab2, ...) in response to a memory block address signal and a timing signal, an equalize control circuit EQCb which outputs equalize instruction signal φEQb from its output driver Df for application to equalize circuit EQb (EQb0, EQb1, ...) in response to a memory block address signal and a timing signal, and a sense amplifier control circuit SACb which outputs sense amplifier activation signal SOb from its output driver Dg to sense amplifier SAb (SAb0, SAb2, ...) in response to a memory block address signal and a timing signal.

These row related circuits operate for operations of selecting a row in memory block MB#i, and their activation timings are determined in response to a row address strobe signal /RAS which will be described below.

FIG. 11 is a diagram schematically showing the configuration of a memory cell MC shown in FIG. 10. In FIG. 11, memory cell MC includes a capacitor MQ for storing information, and an access transistor MT formed of an n channel MOS transistor connecting the storage node SN of capacitor MQ to bit line BL (or /BL). The cell plate node CP of memory capacitor MQ is provided with a fixed cell plate voltage VCP.

FIG. 12 is a diagram showing the configuration of bit line equalize circuit EQ and sense amplifier SA shown in FIG. 10. In FIG. 12, equalize circuit EQ includes an n channel MOS transistor T1 which conducts in response to equalize instruction signal φEQ and electrically short-circuits nodes Nx and Ny, and n channel MOS transistors T2 and T3 which transmit a prescribed precharge voltage VBL to nodes Nx and Ny. Equalize circuit EQ corresponds to equalize circuits EQa1, EQb0 and EQb1 shown in FIG. 10. Nodes Nx and Ny are electrically connected to a corresponding bit line through a bit line isolation gate.

Sense amplifier SA includes p channel MOS transistors PQ1 and PQ2 having their gates and drains cross-coupled, n channel MOS transistors NQ1 and NQ2 having their gates and drains cross-coupled, a p channel MOS transistor PQ3 which conducts in response to a sense amplifier activation signal /SOP and transmits power supply voltage VCC to the sources of p channel MOS transistors PQ1 and PQ2, and an n channel MOS transistor NQ3 which conducts in response to a sense amplifier activation signal SON and transmits ground voltage GND to the sources of n channel MOS transistors NQ1 and NQ2. The drains of MOS transistors PQ1 and NQ1 are connected to node Nx, and the drains of MOS transistors PQ2 and NQ2 are connected to node Ny.

Sense amplifier activation signals SON and /SOP correspond to sense amplifier activation signal SOa or SOb shown in FIG. 10. Now, the operation of the semiconductor memory device shown in FIGS. 9 to 12 will be described in conjunction with FIG. 13, its operation waveform chart. In FIG. 13, operation waveforms when word line WL0 in memory block MB#i is selected are shown by way of illustration.

Before time t0, when row address strobe signal /RAS is at an H level, the semiconductor memory device is in a stand-by state. In this state, equalize instruction signal φEQ is at an H level, equalize circuits EQ (EQa1, EQb0, EQb1) are all in the active states, and nodes Nx and Ny are precharged to a prescribed intermediate voltage VBL level. Bit line isolation control signals BLI (BLIa0, BLIa1, and BLIb) are at an H level, bit line isolation gates IG (IGca, IGaa1, IGab0, IGab2) are in their conductive states, and each bit line pair BLP (BLP0 to BLP2) is electrically connected to node Nx and Ny shown in FIG. 12 through a corresponding bit line isolation gate and precharged to prescribed intermediate voltage VBL level by the function of equalize circuit EQ.

Sense amplifier activation signal /SOP is at an H level, sense amplifier activation signal SON is at an L level, MOS transistors PQ3 and NQ3 for activating sense amplifiers shown in FIG. 12 are in a non-conductive state, and sense amplifier SA is in an inactive state. The signal potential on column select line CSL from the column decoder is also at an L level.

At time t0, as row address strobe signal /RAS falls to an L levels a memory cycle is initiated. In response to the falling of row address strobe signal /RAS, an address signal applied at the time is incorporated as an X address signal to produce an internal address signal. The X address signal includes a memory block address signal to designate a memory block and a row address signal to designate a word line. Since memory block MB#i is designated, bit line equalize signals φEQ (φEQa and φEQb) to sense amplifier bands SB#i and SB#i+1 provided corresponding to memory block MB#i are brought to an L level, equalize circuit EQ is inactivated, and a precharging operation to bit line pair BLP included in memory block MB#i is stopped.

At the time, bit line isolation control signal BLIa0 is also pulled to an L level, bit line isolation gate IGca is brought into a non-conduction state, and each bit line pair in memory block MB#i−1 is isolated from sense amplifier band SB#i. Similarly, memory block MB#i+1 which is not shown is isolated from sense amplifier band SB#i+1. Therefore, sense amplifier bands SB#i and SB#i+1 are connected only to memory block MB#i in this state.

Row decode circuit RD (see FIG. 10) performs a decoding operation on the received X address signal, and generates a signal to designate word line WL0 in memory block MB#i. Word line driver WD0 drives word line WL0 to an H level accordingly. The remaining word lines WL1 to WLn are in a non-selected state, and their potentials are maintained at an L level.

When word line WL0 is selected, the transistors MT of memory cells MC connected to the selected word line WL0 conduct, and data stored in the capacitor MQ of each memory cell MC is read out onto a corresponding bit line BL. In FIG. 13, the waveform of H level data read out onto bit line BL or /BL is shown by way of illustration. In bit line pair BLP, a bit line to which a selected memory cell is not connected maintains its intermediate voltage VBL level, and provides a reference potential for memory cell data.

Then, as the potential difference between the bit lines becomes large enough, sense amplifier activation signals SON and /SOP are activated and brought into an H level and an L level, respectively MOS transistors PQ3 and NQ3 shown in FIG. 12 conduct accordingly, thus activating sense amplifier SA. MOS transistors PQ1 and PQ2 differentially amplify bit line potentials transmitted onto nodes Nx and Ny and brings a node (bit line) with a higher potential to the power supply voltage Vcc level, while driving the lower potential bit line of the bit line pair connected to nodes Nx and Ny to the ground voltage GND level.

In parallel with the row selecting operation, at time t1, column address strobe signal /CAS falls to an active L level, thus initiating a column selecting operation. In response to the falling of column address strobe signal /CAS, an address signal applied concurrently is incorporated as a Y address signal, the column decoder CD decodes the received Y address signal, and drives a column select signal transmission line CSL corresponding to a column thus addressed to a selected state (H level).

Then, data is written/read out to/from a memory cell provided at a crossing of the addressed word line WL0 and column select signal transmission line CSL. Data is read out in response to a falling of column address strobe signal /CAS, and data is written when column address strobe signal /CAS and a write enable signal /WE instructing data writing both attain an active state.

At time t2, row address strobe signal /RAS and column address strobe signal /CAS both attain an H level of inactive state, thus completing the memory cycle. In response to the rising of row address strobe signal /RAS, the potential of word line WL0 falls to an L level, then sense amplifier activation signals SON and /SOP are inactivated, bit line isolation control signals BLI all attain an H level, equalize instruction signal φEQ then attains an H level, and the bit lines in memory blocks MB#i, MB#i−1 and MB#i+1 are again precharged to the intermediate voltage VBL level by the function of the bit line equalize circuit.

Meanwhile, in response to the rising of column address strobe signal /CAS, the column decoder is inactivated, and the potential of column select signal transmission line CSL in a selected state falls to an L level.

In the shared sense amplifier architecture as described above, the length of a bit line to be driven by a sense amplifier is shortened, the capacitance of load of the bit line driven by the sense amplifier is reduced accordingly, so that data read out from a memory cell can be sensed and amplified accurately and at a high speed.

In addition, only a selected memory block is driven with the remaining non-selected memory blocks being maintained in a precharged state, current consumption may be greatly reduced as compared to a case of driving all the memory blocks.

FIG. 14 is a diagram schematically showing the chip layout of a semiconductor memory device. In FIG. 14, the semiconductor memory device is formed on a rectangular chip CH having a longer side LS and a shorter side SS. The chip is divided into four regions by the central region CRL with respect to the longer side LS and the central region CRS with respect to the shorter side SS, and memory mats MM#1 to MM#4 are provided in these four regions. Memory mats MM#1 to MM#4 each having the same configuration as that shown in FIG. 9 are divided into a plurality of memory blocks and have sense amplifier bands provided between adjacent memory blocks.

Row related circuits RRC1 to RRC4 performing operations associated with a row selection are provided along the longer side of chip CH, and column decoders CD1 to CD4 for performing column selection are provided along the shorter side. Row related circuits RRC1 to RRC4 having the same configuration as that shown in FIGS. 9 and 10 each include a row decode circuit, a bit line isolation control circuits word line drives circuit, and a sense amplifier control circuit. Output drivers (which may be word line drivers) OD1 to OD4, one for each of row related circuits RRC1 to RRC4, are shown in FIG. 14. Output signal lines (or word lines) from output drivers OD1 to OD4 extend along the shorter side in corresponding memory mats MM#1 to MM#4.

In the center of central regions CRL and CRS, there is provided a master control circuit MCTL which produces an internal address signal and an internal control signal based on an externally applied address signal and a control signal and transmits the produced signals to local control circuits (including a row related circuit and a column decoder) for each of memory mats MM#1 to MM#4. A signal from master control circuit MCTL is applied to row related circuits RRC1 and RRC2 through a master control signal transmission bus MSGL1, and applied to row related circuits RRC3 and RRC4 through a master control signal transmission bus MCGL2 provided in central region CRS between memory mats MM#3 and MM#4. Row related circuits RRC1 to RRC4 drive corresponding memory mats based on signals applied through master control signal transmission buses MSGL1 and MSGL2.

If the storage capacity of a semiconductor memory device is 256 M bits, for example, memory mats MM#1 to MM#4 each has a 64 M bit-storage capacity. Therefore, in the semiconductor memory device with such a large memory capacity, the size of the semiconductor chip CH is large, and the longer side LS and shorter side SS will be long as a result. The lengths of master control signal transmission buses MSGL1 and MSGL2 are great accordingly, which increases the interconnection resistance and interconnection capacitance, and it would be difficult for master control circuit MCTL to drive master control signal transmission buses MSGL1 and MSGL2 at a high speed. A driver with an extremely large driving capability could be provided in the output stage of master control circuit MCTL for the purpose of high speed driving, but the circuit size will be increased as a result, and such circuit architecture is not suitable for high density and high integration.

A shorter side of each of memory mats MM#1 to MM#4 has a length about half that of a shorter side of semiconductor chip CH. In each of memory mats MM#1 to MM#4, the shorter side becomes long, and the generally represented signal lines SG1 to SG4 will be long. Therefore, the output loads of generally represented output drivers OD1 to OD4 are large (as a large number of transistors are connected to signal lines SG1 to SG4), and it would be difficult for output drivers OD1 to OD4 to drive corresponding signal lines SG1 to SG14 at a high speed.

If, for example, one memory mat is divided into 32 memory blocks, and one memory mat has a storage capacity of 64 M bits, the memory capacity of a memory block is 2

M bits. In this case, 1 K word lines WL and 2 K pairs of bit lines are provided in a single memory block. The number of word lines crossing bit line pair BLP should be as small as possible, because the length of a bit line is shortened, and the bit line capacitance is reduced, so that voltage change is surely generated on bit lines based on data read out from a memory cell. The voltage change by read out data in the bit lines is usually called read out voltage and in proportion to Cb/Cs. Herein, Cb is bit line capacitance and Cs is memory cell capacitance. In order to obtain more sufficient read out voltage, the number of word lines crossing bit lines is set about as many as 512 at most. Therefore, in one memory block, 512 word lines and 4 K pairs of bit lines are provided. More specifically, 4 K pairs of bit lines cross one word line, and therefore the load of the word line is extremely large due to the capacitance of the gates of memory transistors and interconnection line capacitance. Therefore, it would be difficult to drive the word line at a high speed, and therefore memory cell data cannot be read out at a high speed.

For other bit line isolation control signals or the like, the number of MOS transistors to be connected thereto is increased, and the load capacitance becomes extremely large due to the gate capacitance and interconnection line length.

Signal propagation delay due to the interconnection line capacitance and interconnection line resistance in master control signal transmission buses MSGL1 and MSGL2 and signal propagation delay due to large load capacitance and interconnection line resistance in signal lines within each memory mat MM#1 to MM#4 or word lines SG1 to SG4 impede row selecting operation at a high speed, which increases time required for accessing as well.

Furthermore also in column decoders CD1 to CD4, the output signal lines therefor, column select signal transmission lines CSL are provided over all the memory blocks along the longer side in corresponding memory mats MM#1 to MM#4. Therefore also in the column select signal transmission lines, signal propagation delay is caused by the interconnection line resistance and interconnection line capacitance involved, which impedes high speed transmission of a column select signal, and column selection cannot be performed at a high speed as a result.

As described above, signal lines provided along the shorter side and longer side of a chip are increased in length as the memory capacity of the semiconductor memory device increases, which makes it difficult to propagate signals at a high speed, and high speed accessing cannot be achieved as a result.

SUMMARY OF THE INVENTION

It is an object of the invention to provide a semiconductor memory device which permits high speed accessing by propagating a signal to drive a memory mat at a high speed even when the semiconductor chip size increases.

Another object of the invention is to provide a semiconductor memory device which permits high speed accessing with no signal propagation delay even if the chip size increases.

A semiconductor memory device according to a first aspect of the invention includes a plurality of memory mats each having a plurality of memory cells arranged in rows and columns, a master control circuit which produces an internal address signal and an internal control signal common between these plurality of memory mats, based on an externally applied signal including an address signal, a plurality of local control circuits provided to each memory mat to control the operation of accessing a memory cell in a corresponding memory mat based on the internal address signal and internal control signal from the master control circuit, and buffer circuitry provided between the master control circuit and each local control circuit to buffer a signal from the master control circuit and transmits the buffered signal to each local control circuit.

A semiconductor memory device according to a second aspect includes a memory mat formed on a rectangular semiconductor chip having a first side and a second side longer than the first side, having a shorter side along the first side and a longer side along the second side, and having a plurality of memory cells arranged in rows and columns, row select circuitry provided along the shorter side of the memory mat to drive a row addressed based on a first address signal into a selected state, and column select circuitry provided along the longer side of the memory mat to select a column addressed based on a second address signal.

A signal from the master control circuit which produces an internal signal based on an externally applied signal may be transmitted to each of the plurality of memory mats through the buffer circuitry at a high speed even if the output signal line of the master control circuit is long.

Furthermore, the row select circuitry is provided along the shorter side of the memory mat, the column select circuitry is provided along the longer side, the signal line to be driven by the row select circuitry may be about as long as conventional cases, and an internal signal transmission bus does not have to be provided along the entire longer side of the memory mat, which alleviates the load of the internal signal transmission line and reduces signal propagation delay.

Furthermore, the column select circuitry is provided along the longer side of the memory mat, the column select signal transmission line, or the output signal line of the column select circuitry is provided only along the shorter side of a corresponding memory mat, in other words, it does not have to be provided along the entire longer side of the memory mat, and therefore a column select signal may be transmitted at a high speed.

The foregoing and other objects, features, aspects and advantages of the present invention will become more apparent from the following detailed description of the present invention when taken in conjunction with the accompanying drawings.

9

Figure 8:
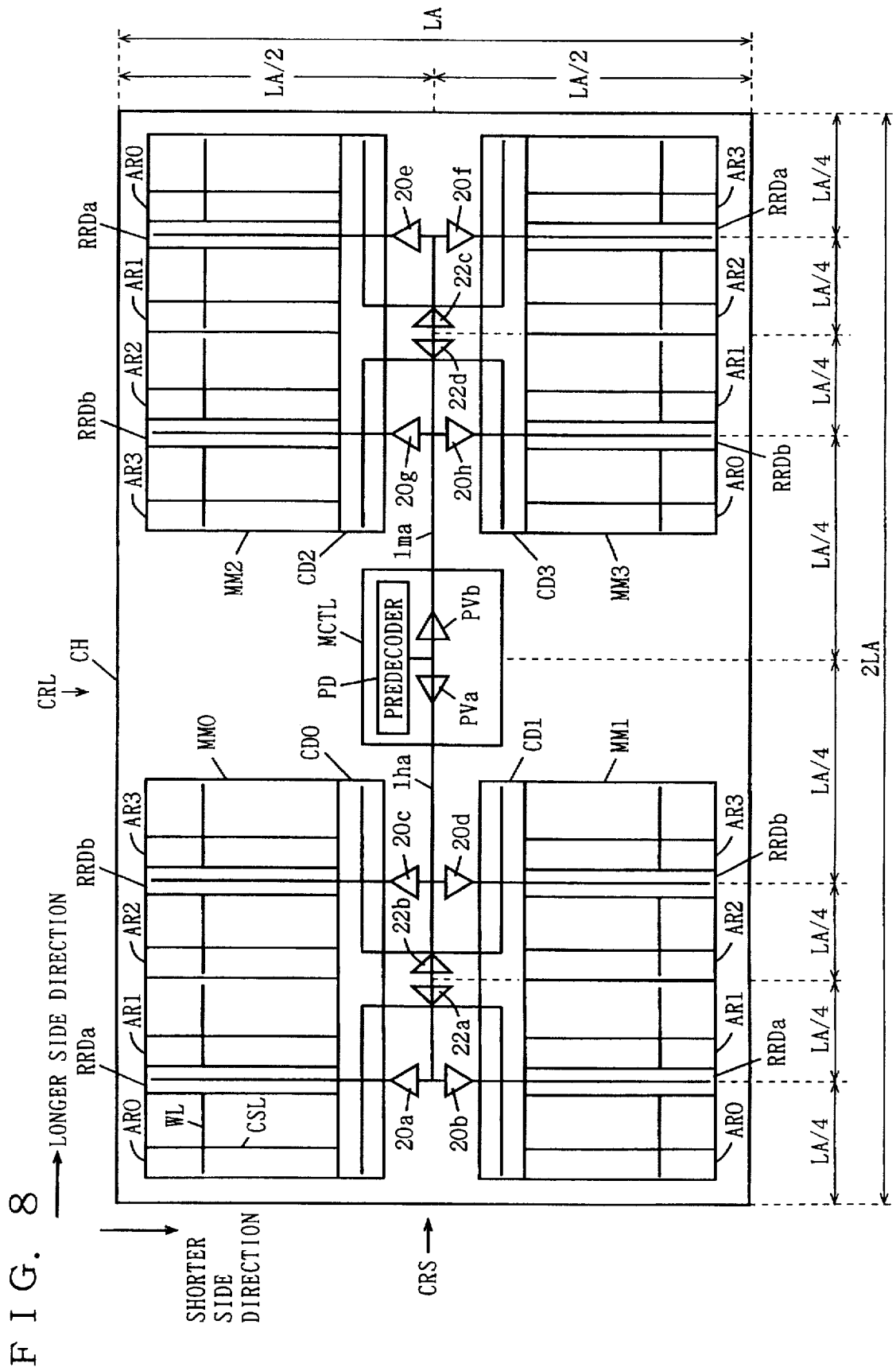
Figure 9:
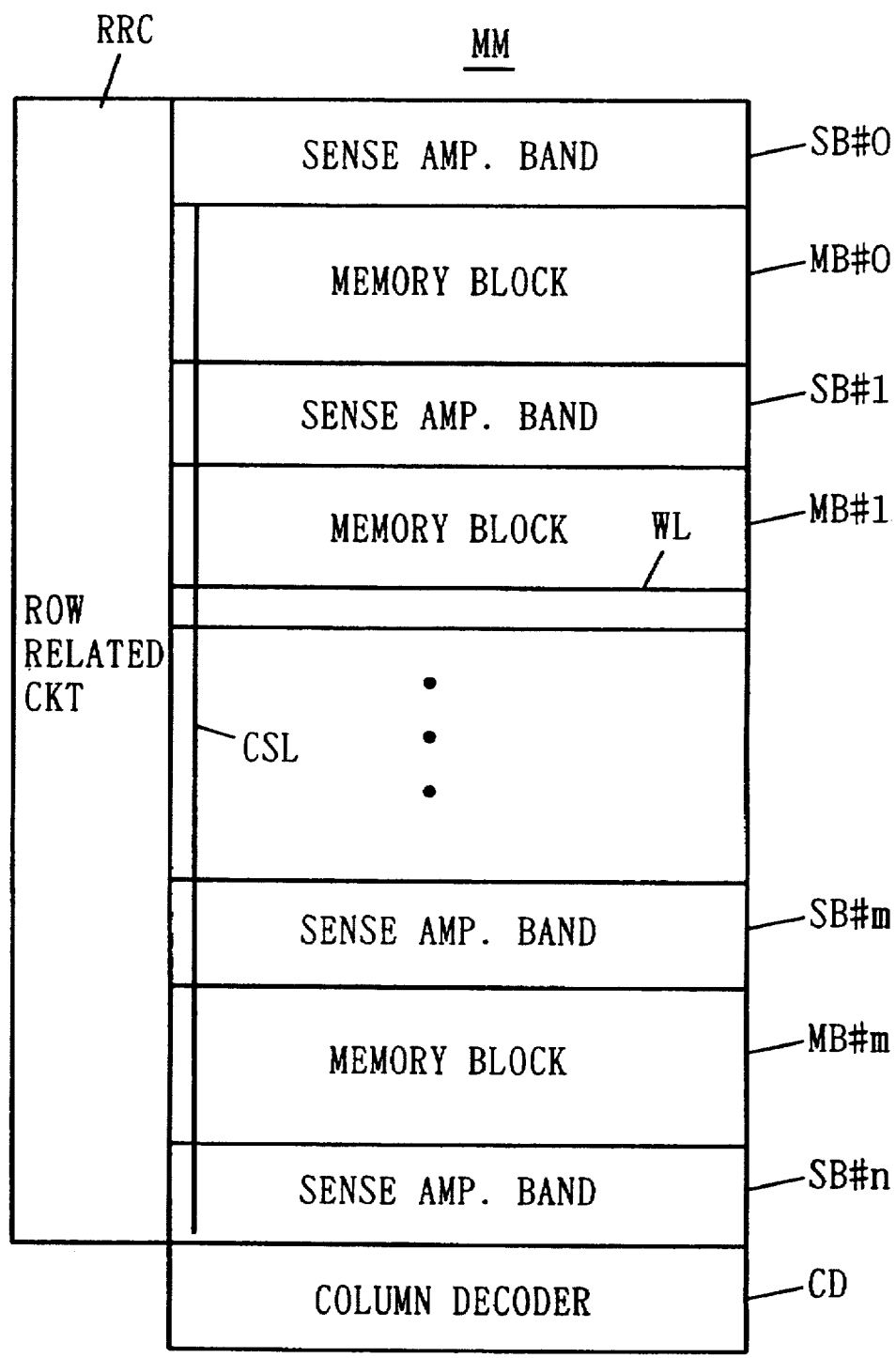
Figure 10:
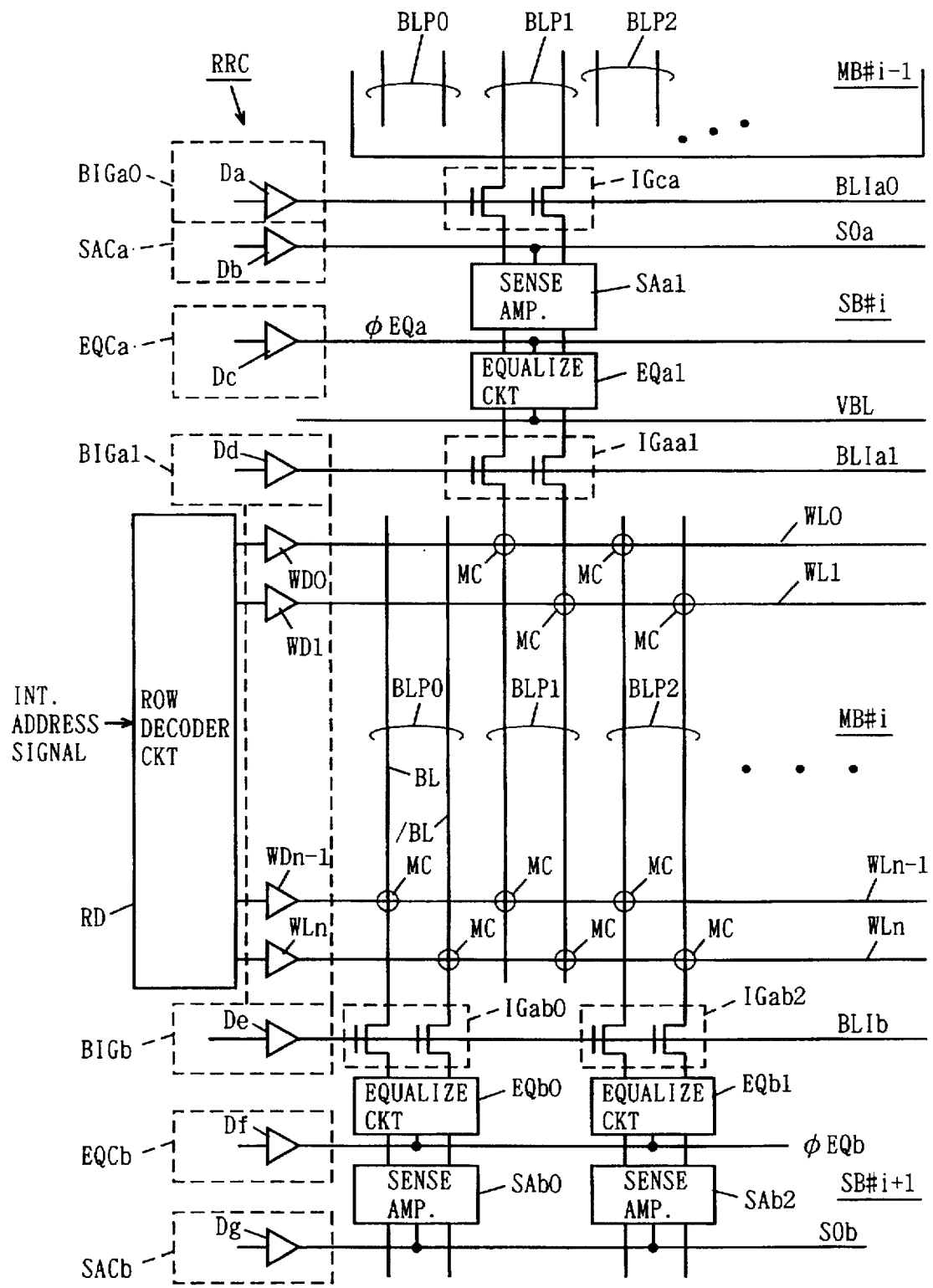
Figure 11:
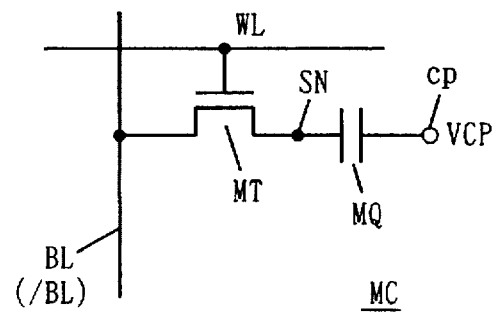
Figure 12:
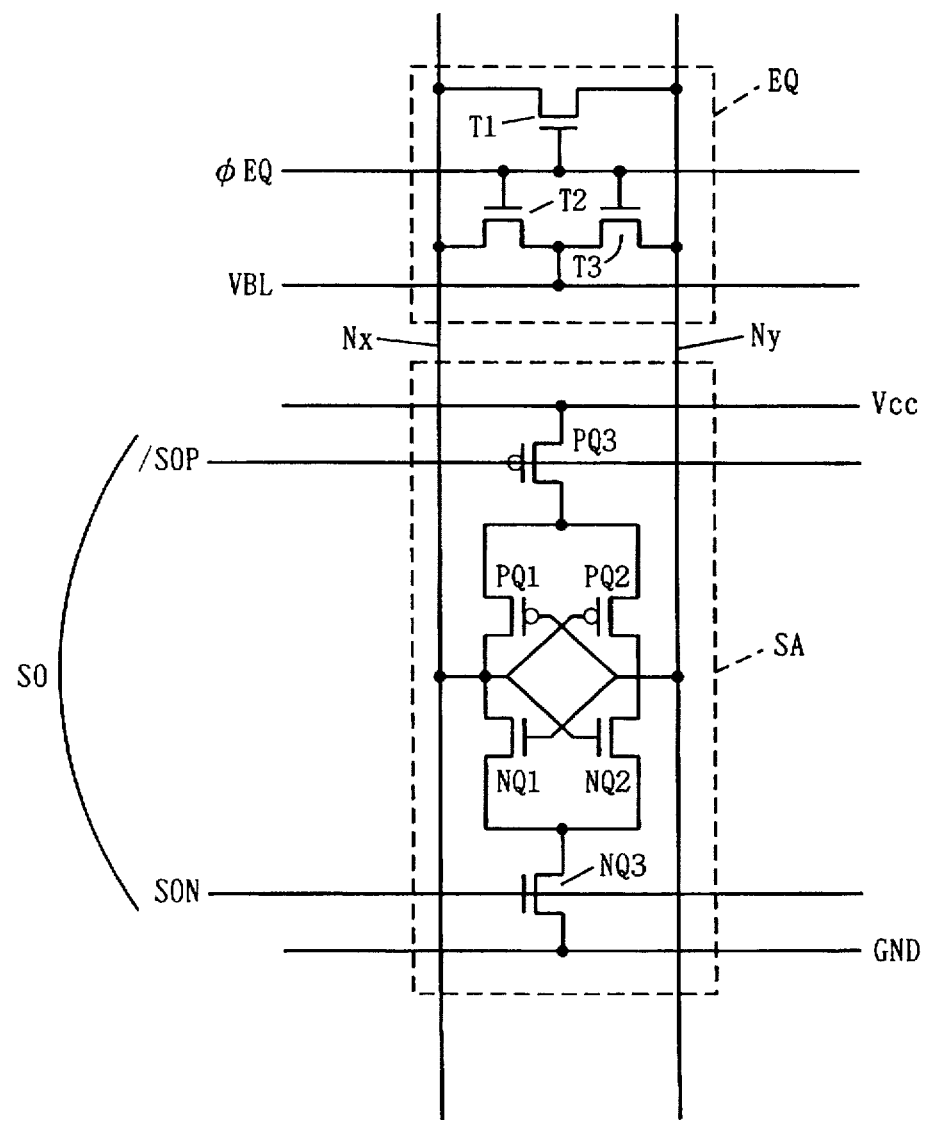
Figure 13:
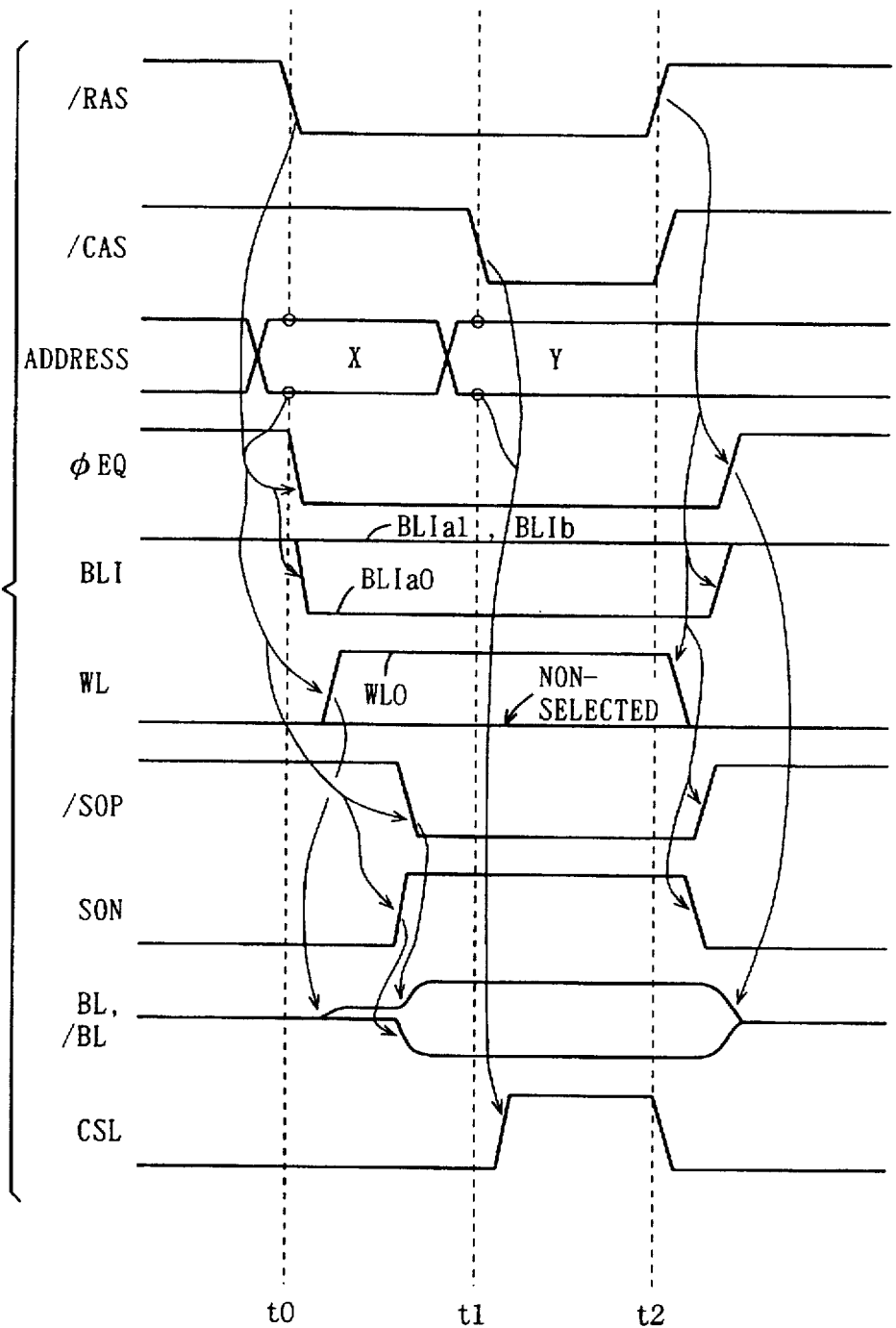
Figure 14:
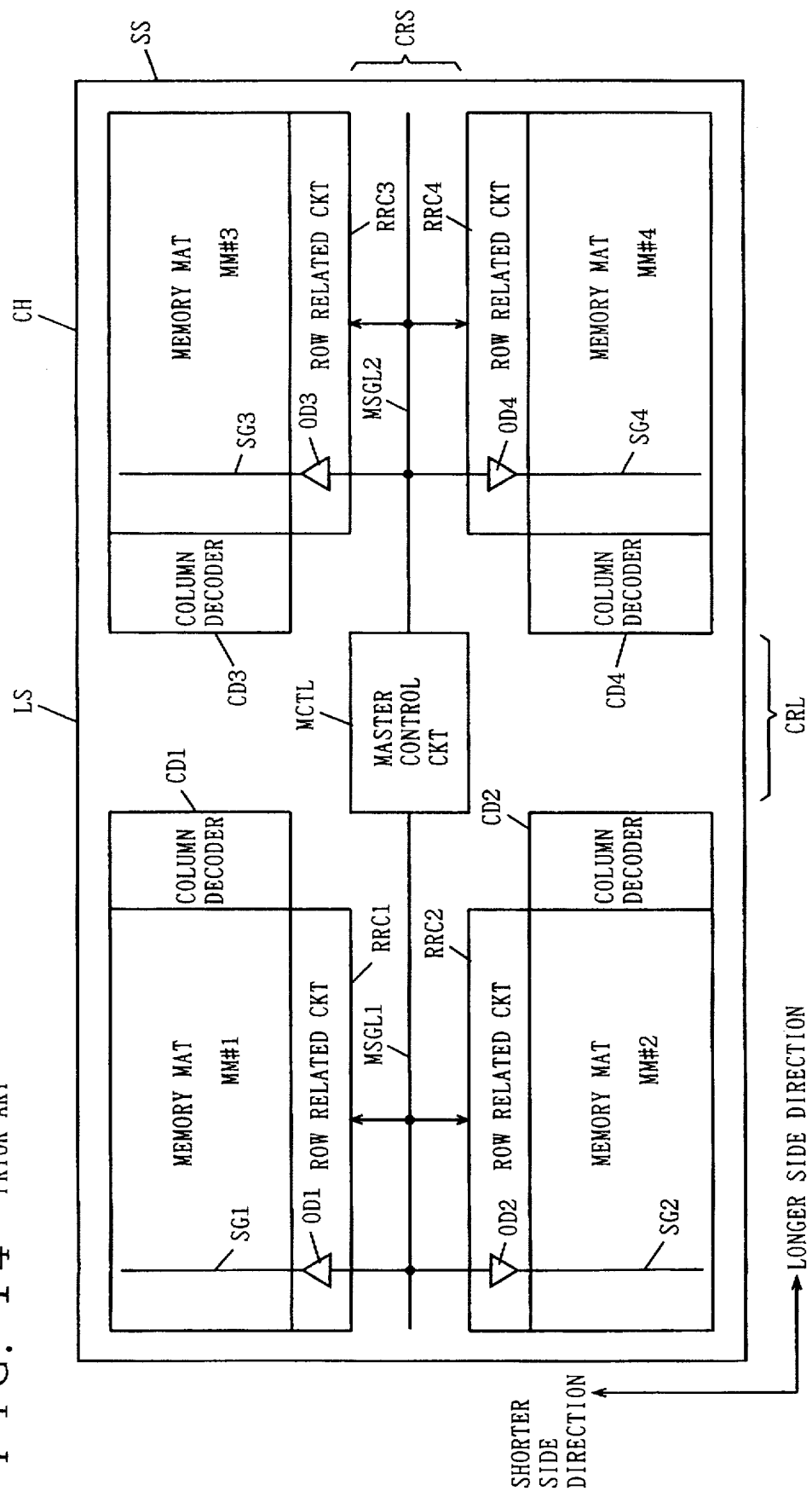

FIG. 8 is a diagram schematically showing the chip layout of a semiconductor memory device according to a fourth embodiment of the invention;

FIG. 9 is a diagram schematically showing the configuration of a memory mat in a conventional semiconductor memory device;

FIG. 10 is a diagram schematically showing the configuration of the memory block shown in FIG. 9;

FIG. 11 is diagram schematically showing the configuration of the memory cell shown in FIG. 10;

FIG. 12 is a diagram showing the configuration of the sense amplifier and equalize circuit shown in FIG. 10 by way of illustration;

FIG. 13 is a signal waveform chart representing the operation of the semiconductor memory device shown in FIGS. 9 to 12; and FIG. 14 is a diagram schematically showing the chip layout of a conventional semiconductor memory device.

DESCRIPTION OF THE PREFERRED EMBODIMENTS

First Embodiment

Figure 1:
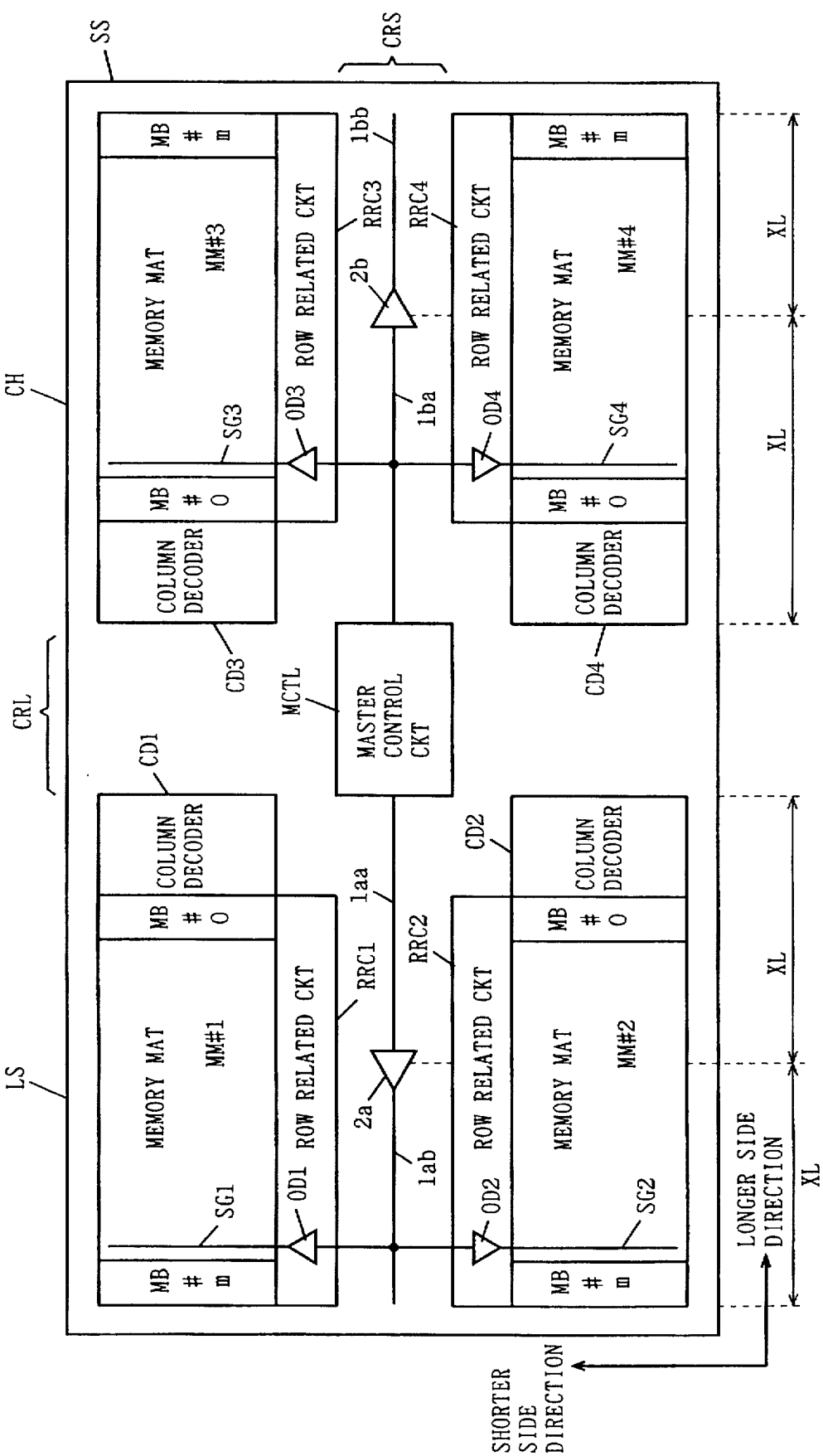
FIG. 1 is a diagram schematically showing the chip layout of a semiconductor memory device according to a first embodiment of the invention.

FIG. 1 is a diagram schematically showing the chip layout of a semiconductor memory device according to a first embodiment of the invention. In FIG. 1, the semiconductor memory device is formed on a semiconductor chip CH having a longer side LS and a shorter side SS. In four regions divided by a central region CRL for the longer side LS of semiconductor chip CH and a central region CRS for shorter side SS, memory mats MM#1 to MM#4 are provided. Memory mats MM#1 to MM#4 are each divided into a plurality of memory blocks MB#0 to MB#m along the longer side. In each of memory blocks MB#0 to MB#m, memory cells are arranged in rows and columns.

Corresponding to memory mats MM#1 to MM#4, row related circuits RRC1 to RRC4 are provided facing central region CRS extending along the longer side, while column decoders CD1 to CD4 are provided along the shorter side and facing central region CRL.

Row related circuits RRC1 to RRC4 each include circuits to control circuit portions operating in response to a row address strobe signal /RAS, in other words, include a row decoder, a sense amplifier control circuit, a bit line isolation control circuit, and an equalize control circuit.

Column decoders CD1 to CD4 are each activated in response to an activation of column address strobe signal /CAS, and decode an internal column address signal applied from master control circuit MCTL to select a column in a corresponding memory mat. A column select signal line, or the output signal line of each of column decoders CD1 to CD4 is provided extending along the longer side direction over memory blocks MB#0 to MB#m included in corresponding memory mats MM#1 to MM#4, though not explicitly shown in FIG. 1.

Master control circuit MCTL is provided at the crossing portion of central regions CRL and CRS. An internal signal from master control circuit MCTL is transmitted through master control signal transmission buses 1aa and 1ba provided extending along the longer side direction. Master control buses 1aa and 1ba are in turn provided with buffer circuits 2a and 2b for buffering an applied signal (including both amplification and waveform processing). The output signals of buffer circuits 2a and 2b are transmitted to master control signal transmission buses 1ab and 1bb, respectively provided in central region CRS along the longer side direction.

10

The lengths of master control signal transmission buses 1aa and 1ab are both substantial equal XL, buffer circuit 2a is provided substantially in the center of corresponding memory mats MM#1 and MM#2 along the longer side. Similarly, master control signal transmission buses 1ba and 1bb have a virtually equal length XL, and buffer circuit 2b is provided in the vicinity of the central portion of corresponding memory mats MM#3 and MM#4 along the longer side.

Internal signals (including an address signal and a control signal) on master control signal transmission buses 1aa and 1ab are applied to row related circuits RRC1 and RRC2 provided facing central region CRS. Internal signals on master control signal transmission buses 1ba and 1bb are transferred to row related circuits RRC3 and RRC4 provided facing central region CRS. Row related circuits RRC1 to RRC4 each perform a prescribed processing to an applied signal to drive a corresponding memory mat.

In FIG. 1, in row related circuits RRC1 to RRC4, output drivers OD1 to OD4 in the final output stage are representatively shown. Output driver OD1 may be an output driver to drive a sense amplifier activation signal, a bit line isolation control signal, an equalize instruction signal, or a word line driver provided at a row decoder output stage.

In the configuration shown in FIG. 1 the master control circuit needs only drive master control signal transmission buses 1aa and 1ba, the length is about ½ that of conventional devices, and therefore master control signal transmission buses 1aa and 1ba may be driven at a high speed to transmit a signal (since the lengths of these buses are shortened, and line capacitance is reduced.) Therefore, it is not necessary to provide a drive circuit having a extremely large driving capability at the output stage of the master control circuit MCTL, and master control signal transmission buses 1aa and 1ba may be driven at a high speed without increasing the area occupied by master control circuit MCTL.

Buffer circuits 2a and 2b need only drive master control signal transmission buses 1ab and 1bb having a length of about ¼ the length of longer side LS along the longer side, the line resistance and line capacitance of these buses are small, and therefore buffer circuits 2a and 2b can drive master control signal transmission buses 1ab and 1bb, respectively at a high speed. Therefore, a signal can be propagated at a high speed to the final ends (facing the shorter side SS) of master control signal transmission buses 1ab and 1bb by buffer circuits 2a and 2b, and row related circuits RRC1 to RRC4 can drive corresponding memory mats MM#1 to MM#4 based on a signal made definite at an earlier timing, which enables high speed accessing.

Figure 2:
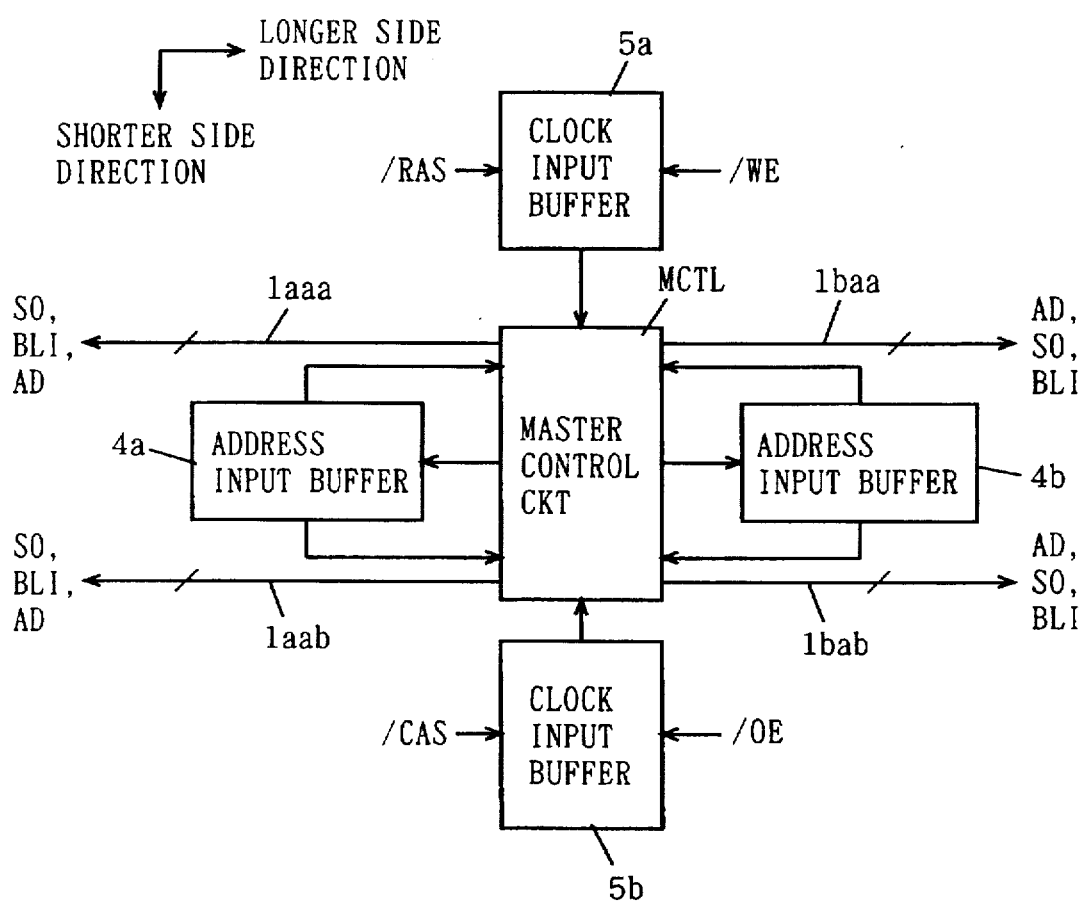
FIG. 2 is a diagram showing the configuration of the master control circuit portion shown in FIG. 1 in more detail.

FIG. 2 is a diagram schematically showing the configuration of part related to master control circuit MCTL in the flow shown in FIG. 1. On both sides of master control circuit MCTL along the longer side, there are provided address input buffers 4a and 4b to produce an internal address signal in response to an externally applied address signal, while on both sides of master control circuits MCTL along the shorter side, clock input buffers 5a and 5b which receive externally applied clock signals. Clock input buffer 5a receives externally applied row address strobe signal /RAS and write enable signal /WE to produce an internal row address strobe signal and an internal write enable signal, while clock input buffer 5b receives externally applied column address strobe signal /CAS and output enable signal OE to produce an internal column address strobe signal and an internal output enable signal for application to master control circuit MCTL.

Master control circuit MCTL controls the operations of address buffers 4a and 4b based on internal clock signals applied from clock input buffers 5a and 5b, and transfers internal address signals together with each timing signal to master signal transmission buses. In FIG. 2, master control signal transmission bus 1aa is divided into a master control signal transmission bus 1aaa for memory mat MM#1 and a master control signal transmission bus 1aab for memory mat MM#2. Similarly, master control signal transmission bus 1ba is divided into a master control signal transmission bus 1baa for memory mat MM#3 and a master control signal transmission bus 1bab for memory mat MM#4 by way of illustration.

Also in FIG. 2, master control signal transmission buses 1aaa, 1aab, 1baa, and 1bab transmit sense amplifier activation signal SO, bit line isolation control signal BLI and internal address signal AD. Master signal transmission buses 1aaa, 1aab, 1baa and 1bab additionally transmit bit line equalize instruction signal φEQ and a decoder enable signal. Signal generated in association with row address strobe signal /RAS are transmitted to master control signal transmission buses 1aaa to 1bab.

In the configuration shown in FIG. 2, address input buffers 4a and 4b and clock input buffers 5a and 5b each include therein a pad, to which a frame lead extending up to the center of the chip is electrically connected. Thus providing the pad in the central region permits a signal to be readily transmitted to each memory mat without complexity of signal lines.

According to the first embodiment of the invention, a buffer is provided to a bus transmitting an internal signal from a master control circuit, an internal signal is transmitted to each memory mat through the buffer, and therefore a signal may be transmitted by the buffer at a high speed even if the bus from the master control circuit is long, so that each memory mat may be driven without signal propagation delay and that high speed accessing is enabled as well.

Particularly by providing the buffer in the vicinity of the center of a corresponding memory mat along the longer side, a signal may be propagated at a high speed with an equal output driving capability without increasing the output driving capabilities of the buffer circuit and master control circuit.

Second Embodiment

Figure 3:
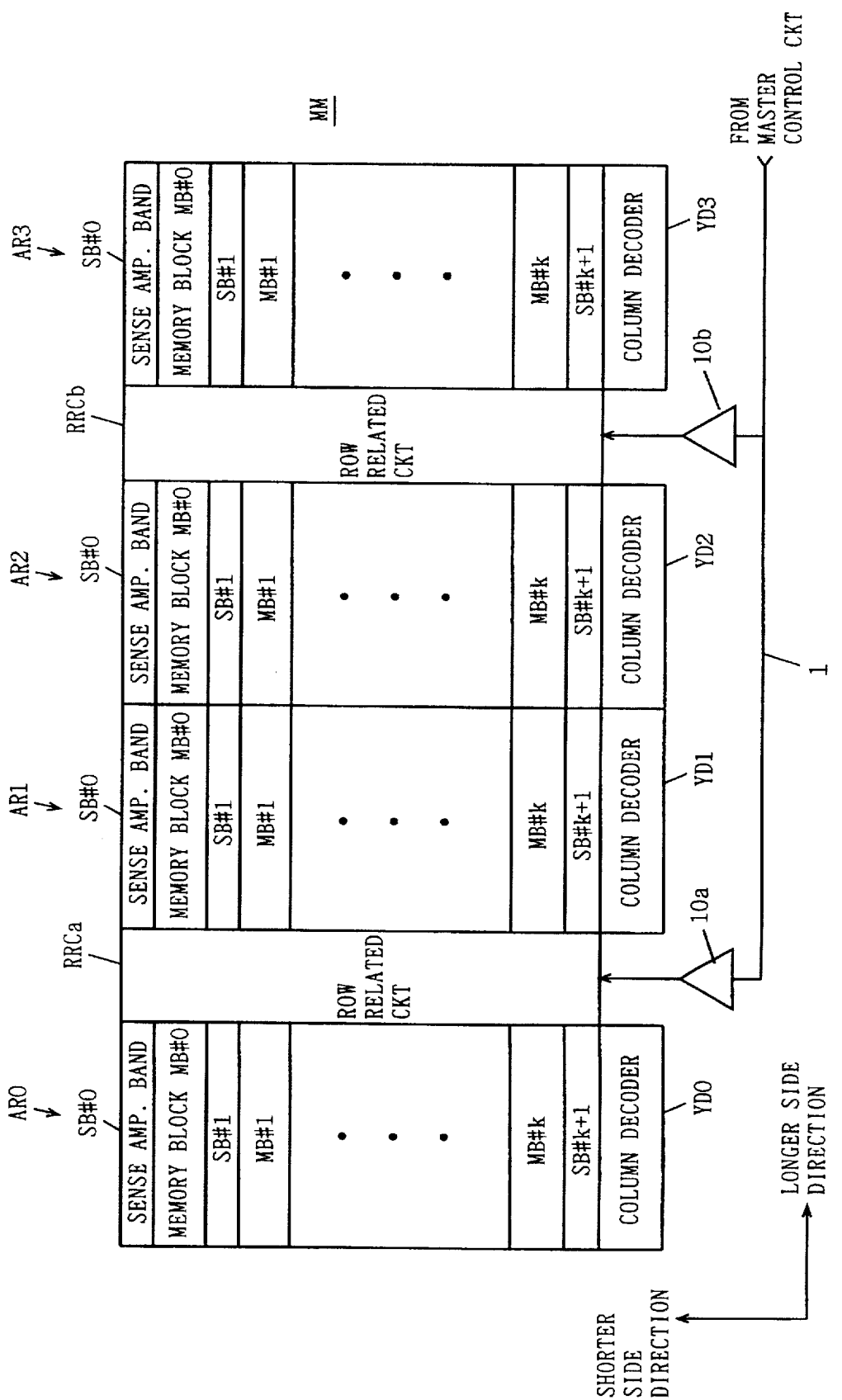
FIG. 3 is a diagram schematically showing the configuration of one memory mat in a semiconductor memory device according to a second embodiment of the invention.

FIG. 3 is a diagram schematically showing the configuration of a main portion of a semiconductor memory device according to a second embodiment of the invention. In FIG. 3, the configuration of one memory mat MM is shown by way of illustration. Memory mat MM is divided into four arrays AR0 to AR3 along the longer side. Memory arrays AR0 to AR3 are each divided into a plurality of memory blocks MB#0 to MB#k along the shorter side. In memory arrays AR0 to AR3, there are provided sense amplifier bands SB#1, . . . between memory blocks MB#0 to MB#k, and sense amplifier bands SB0 and SB#k+1 are provided outside memory blocks MB#0 and MB#k.

In the region between memory arrays AR0 and AR1, a row related circuit RRCa is provided along the shorter side direction, and in the region between memory arrays AR2 and AR3, a row related circuit RRCb is provided along the shorter side direction. Row related circuits RRCa and RRCb each include a bit line isolation control circuit, a sense amplifier control circuit, a row decoder, a word line drive circuit, a bit line equalize control circuit or the like, in other words, include circuit portions which operate based on the row address strobe signal.

Column decoders YD0 to YD3 are provided at the shorter sides of memory cell arrays AR0 to AR3, respectively. Column decoders YD0 to YD3 each select a column in memory blocks MB#0 to MB#k included in corresponding memory arrays AR0 to AR3.

A master control signal transmission bus 1 which transmits an internal signal from a master control circuit which is not shown is provided along the longer side direction, and buffer circuits 10a and 10b which buffer and transmit an internal signal on master control signal transmission bus 1 are provided to row related circuits RRCa and RRCb, respectively. Master control signal transmission bus 1 is provided along memory arrays AR1 to AR3 in the longer side direction, and does not extend into the region corresponding to memory array AR0. Therefore, the length of master control signal transmission bus 1 is about equal to ¾ the length of memory mat MM in the longer side direction.

Figure 4:
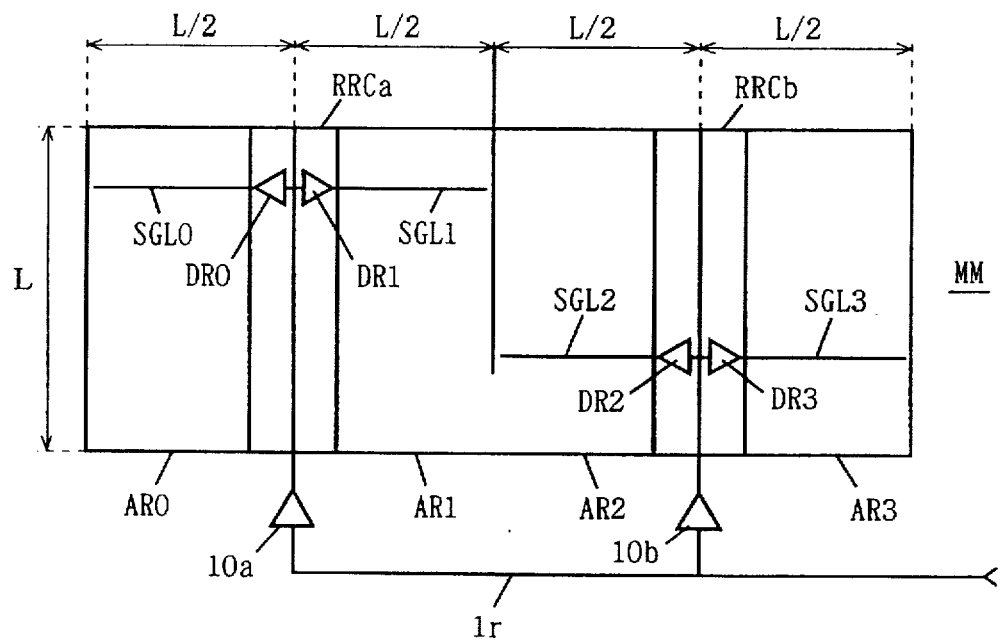
FIG. 4 is a diagram schematically showing a transmission path for a row related signal in the memory mat shown in FIG. 3.

FIG. 4 is a diagram schematically showing a propagation path for a row related signal in the memory mat shown in FIG. 3. The row related signal is activated/inactivated in response to row address strobe signal /RAS. Drivers DR0 and DR1 included in row related circuit RRCa drive signal lines SGL0 and SGL1 extending along the longer side direction of memory mat MM. Drivers DR0 and DR1 are drivers included in the final output stage in row related circuit RRCa and correspond to word line drivers. Signal lines SGL0 and SGL1 correspond to a sense amplifier activation signal transmission line, a word line, a bit line equalize instruction signal transmission line or the like. Signal lines SGL0 and SGL1 extend only within memory arrays AR0 and AR1, respectively.

Similarly, in row related circuit RRCb, output drivers DR2 and DR3 in its final stage drive the signal lines SGL2 and SGL3 in memory arrays AR2 and AR3, respectively. Signal lines SGL2 and SGL3 extend only within memory arrays AR2 and AR3, respectively. Memory arrays AR0 to AR3 are equal in size and the lengths of signal lines SGL0 to SGL3 are substantially equal. The ratio of a shorter side and a longer side of a semiconductor chip is usually 1:2, and therefore the ratio of the length of a shorter side and a longer side of memory mat MM is also 1:2. Now, if the length of the shorter side direction of memory mat MM is L, its length in the longer side direction is 2 L and the length of each of signal lines SGL to SGL3 is about L/2. Therefore, in the arrangement shown in FIG. 4, the length of each of signal lines SGL0 to SGL3 is shorter than the length of the shorter side L, the number of transistors connected to signal lines SGL0 to SGL3 are reduced as well, the output loads of drivers DR0 to DR3 are reduced, and signal lines SGL0 to SGL3 are driven at a high speed as a result.

In addition, master control signal transmission bus 1 is provided only along memory arrays AR1 to AR3 along its longer side direction, the length of master control signal transmission bus 1 may be about ¾ that in the case provided along the entire memory mat MM. The output load of the master control circuit may be reduced as a result. Thus, buffers 10a and 10b buffer signals on master control signal transmission buses 1 to apply the resultant signals to corresponding row related circuits RRCa and RRCb. In this case, the signals may be transmitted along the shorter side direction into row related circuits RRCa and RRCb at a high speed. Therefore, by dividing the memory mat MM into a plurality of memory arrays in the longer side direction, providing row related signal lines (such as word lines) along the longer side direction within each divided memory array, and transmitting an internal signal through a buffer circuit to each row related circuit, operations associated with row selection can be performed at a high speed, and high speed accessing is achieved as well.

Figure 5:
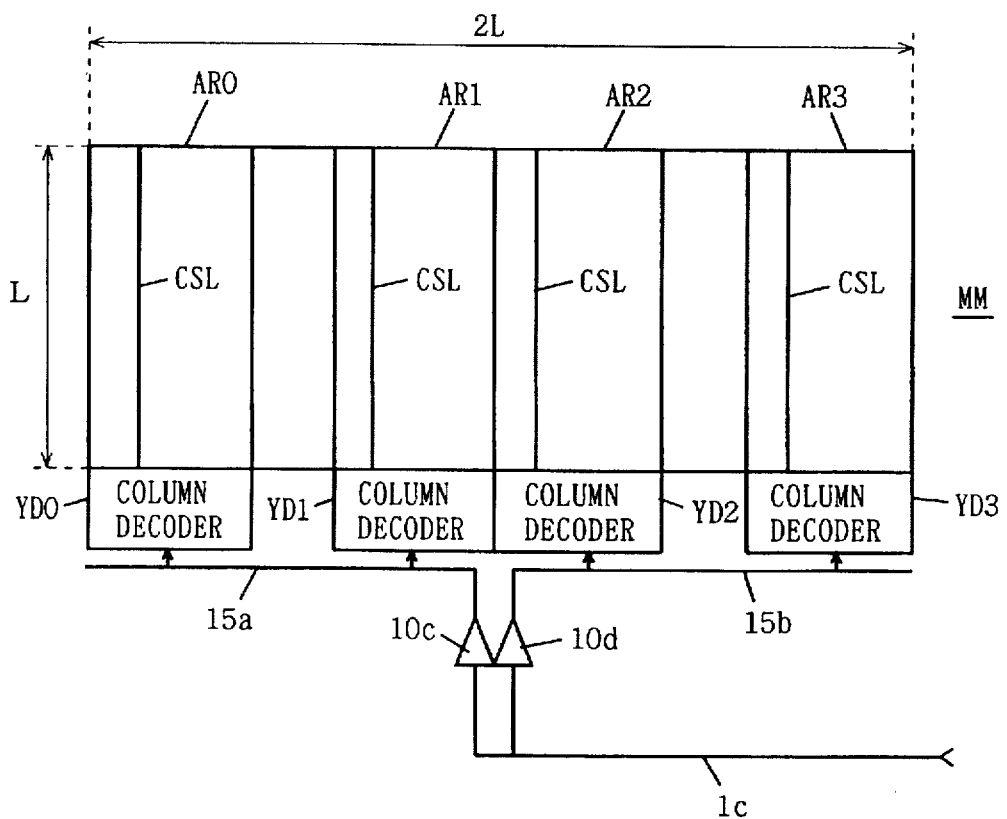
FIG. 5 is a diagram schematically showing a transmission path for a column related signal in the arrangement of the memory mat shown in FIG. 3.

FIG. 5 is a diagram schematically showing a propagation path for a column related signal in the memory mat shown in FIG. 3. In FIG. 5, buffer circuits 10c and 10d are provided to master control signal transmission bus 1. Buffer circuit 10c transmits an internal column address strobe signal and a decode enable signal to column decoders YD0 and YD1 provided to memory arrays AR0 and AR1 through a local control signal transmission bus 15a. The decode enable signal is a column select operation activation signal generated in response to column address strobe signal /CAS and used for a column selecting operation.

Buffer circuit 10d buffers a signal from master control transmission bus 1 and transmits an internal column address signal and a decode enable signal to column decoders YD2 and YD3 provided corresponding to memory arrays AR2 and AR3. Local control signal transmission buses 15a and 15b are provided along the longer side direction toward the opposite directions and have an equal length, or ½ the length of a longer side of memory mat MM. Master control signal transmission bus 1 extends only up to the central portion (the boundary region between memory arrays AR1 and AR2) of the memory mat MM. Therefore, the load of the master control circuit can be also reduced for the column related signals, and the column related control signals can be transmitted at a high speed. Buffer circuits 10c and 10d drive local control signal data buses 15a and 15b having a substantially equal length. Therefore, local control signal data buses 15a and 15b are driven at a high speed, the internal column related signals (column address and column decode enable signals) can be transmitted to column decoders YD0 and YD3 provided on both ends of a longer side of memory mat MM in a substantially equal timing, because data buses 15a and 15b are equal in length, and therefore column select timing may be set earlier (because the timing margin is reduced).

Column decoders YD0 to YD3 each need only drive column select signal transmission lines CSL provided extending along the shorter side direction in memory arrays AR0 to AR3. The length of column select signal transmission line CSL is equal to the length L of a shorter side of memory mats MM. Therefore, the length of column select signal transmission line CSL is ½ the length of column select signal transmission line CSL when extending along the longer side direction of memory mat MM, and therefore column decoders YD0 to YD3 can drive column select signal transmission lines CSL at a high speed. Thus, during column selection, column related signals can be propagated at a high speed to perform a high speed column selecting operation, thus enabling high speed accessing.

Note that buffer circuits 10c and 10d may transmit a signal to drive a preamplifier (to produce read out data) and a write driver (to produce write data) provided to each of memory arrays AR0 to AR3. More specifically, buffer circuits 10c and 10d propagate signals (including an internal column address signal) produced based on column address strobe signal /CAS.

Figure 6:
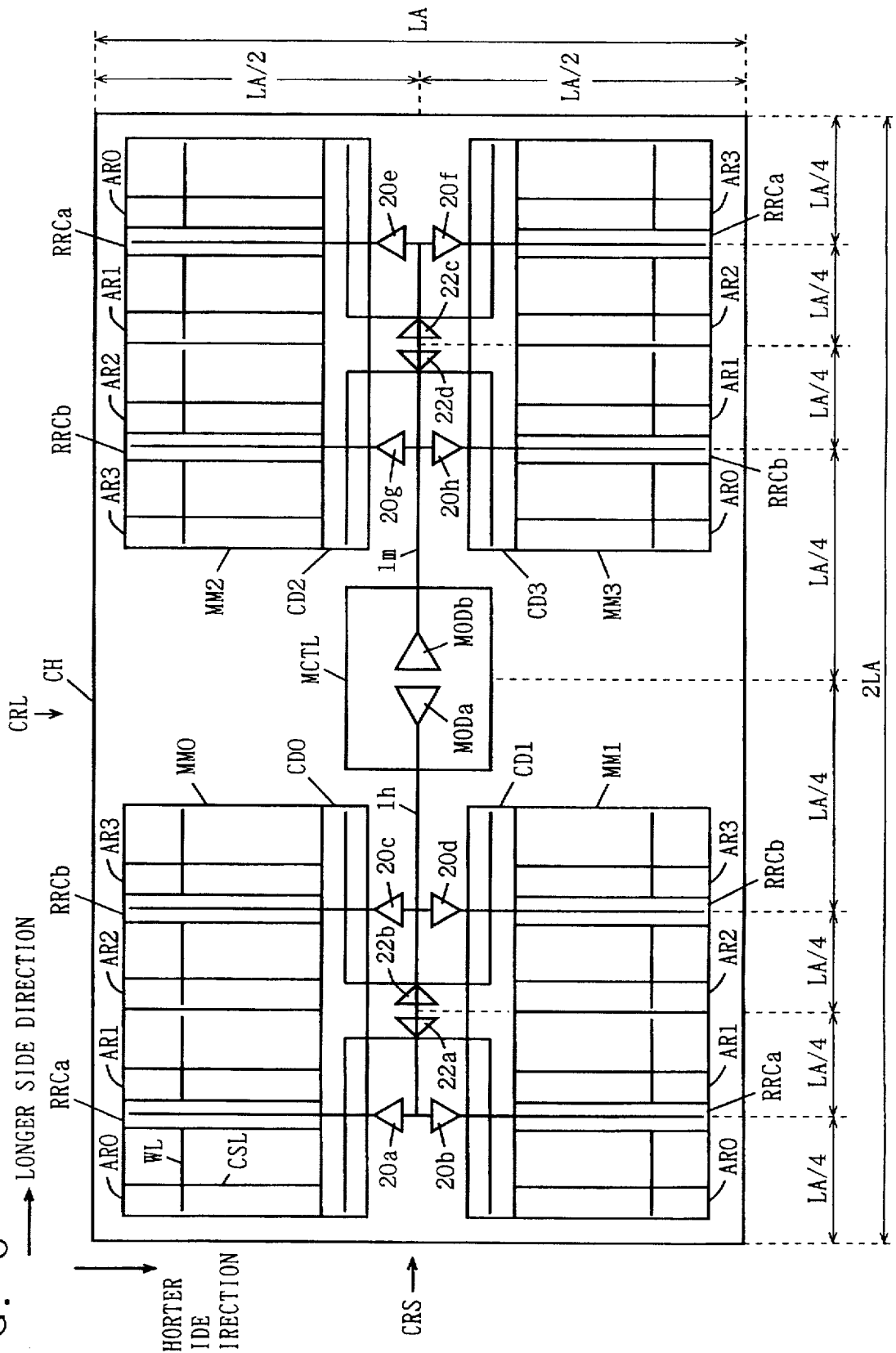
FIG. 6 is a diagram schematically showing the chip layout of the semiconductor memory device according to the second embodiment of the invention.

FIG. 6 is a diagram schematically showing the chip layout of the semiconductor memory device according to the second embodiment. In FIG. 6, the semiconductor memory device is formed on a rectangular semiconductor chip CH having shorter sides and longer sides. The semiconductor chip CH has a shorter side length of LA and a longer side length of 2•LA.

Semiconductor chip CH is divided into four regions by central regions CRS and CRL along the directions of shorter side and longer side. In these four regions, memory mats MM0, MM1, MM2 and MM3 are provided. Memory mats MM0 to MM3 each have the configuration shown in FIG. 3. In other words, memory mats MM0 to MM3 are each divided into four memory arrays AR0 to AR3 along the longer side direction. In each of these memory mats MM0 to MM3, there is provided a row related circuit RRCa extending along the shorter side direction between memory arrays AR0 and AR1, and there is provided a row related circuit RRCb along the shorter side direction between memory arrays AR2 and AR3. In FIG. 6, word lines WL extending along the longer side direction from these row related circuits RRCa and RRCb are shown by way of illustration.

Column decoders CD0 to CD3 are provided along the longer side direction and facing central region CRS in memory mats MM0 to MM3, respectively. In memory mats MM0 to MM3, column select signal transmission lines CSL from column decoders CD0 to CD3 are provided extending along the shorter side.

In the center of semiconductor chip (at the crossing portion of central regions CRL and CRS), a master control circuit MCTL is provided. In FIG. 6, buffer circuits MODa and MODb included in the output stage in master control circuit MCTL are shown by way of illustration. Buffer circuit MODa as an output driver for master control circuit MCTL drives a master control signal transmission bus 1h provided in central region CRS between memory mats MM0 and MM1 and extending along the longer side direction, while buffer circuit MODb as an output driver drives a master control signal transmission bus 1m provided in central region CRS between memory mats MM2 and MM3 and extending along the longer side direction.

Buffer circuits 20a, 20c, 20b and 20d are provided for master control signal transmission bus 1h. Buffer circuits 20a and 20c buffer a signal on master control signal transmission buffer 1h, and transmit thus buffered signal onto row related circuits RRCa and RRCb included in memory mat MM0. Buffer circuits 20b and 20d buffer a signal on master control bus 1h and transmit a resultant signal to row related control circuits RRCa and RRCb provided to memory mat MM1.

Buffer circuits 22a and 22b are further provided for master control signal transmission bus 1h. Buffer circuit 22a buffers a column related signal included in master control signal transmission bus 1h and transmits thus buffered signal onto the column decoder portion provided to memory arrays AR0 and AR1 in memory mats MM0 and MM1, respectively. Buffer circuit 22b buffers a column related signal included in master control signal transmission bus 1h and transmits thus buffered signal to the column decoder portion provided to memory arrays AR2 and AR3 in memory mats MM0 and MM1, respectively.

Corresponding to master control signal transmission bus 1m, buffer circuits 20g, 20e, 20h and 20f to buffer row related signals are provided. Buffer circuits 20g and 20e buffer a row related signal included in master control signal transmission bus 1m and transmit thus buffered signal onto row related circuits RRCb and RRCa provided in memory mat MM2. Buffer circuits 20f and 20h buffers a row related signal on master control signal transmission bus 1m and transmit thus buffered signal onto row related circuits RRCa and RRCb in memory mat MM3.

Corresponding to master control signal transmission bus 1m, buffer circuits 22c and 22d are further provided. Buffer circuit 22c buffers a column related signal included in master control signal transmission bus 1m and transmits thus buffered signal onto the column decoder portion provided for memory arrays AR0 and AR1 in memory mats MM2 and MM3. Buffer circuit 22d buffers a column related signal on master control signal transmission bus 1m and transmits the buffered signal to the column decoder portion provided corresponding to memory arrays AR2 and AR3 in memory mats MM2 and MM3.

Memory mats MM0 to MM3 are equal in size, while memory arrays AR0 to AR3 are equal in size. Central regions CRS and CRL each have a width sufficiently smaller than the length 2•LA along the longer side direction of semiconductor chip CH and the length LA along the shorter side direction. In this case, the length of each of memory mats MM0 to MM3 is almost equal to LA, and the length along their shorter side is LA/2. Therefore, memory arrays AR0 to AR3 each have a length along the longer side direction equal to LA/4 and a length along the shorter side direction equal to LA/2.

As have been described in conjunction with FIGS. 4 and 5 the length of a signal line (such as word line WL) to be driven by row related circuits RRCa and RRCb is about LA/4 in memory mats MM0 to MM3, and shorter than its length along the shorter side direction, which permits operations associated with row selection to be executed at a high speed.

Buffer circuits 22a and 22b, 22d and 22c to buffer a column related signal are provided in the central position for the longer side direction of corresponding memory mats, drivers MODa and MODb in the output stage of master control circuit MCTL need only drive a signal line as long as LA/2 in the longer side direction as to the column related signals, and therefore the column related signals may be transmitted at a high speed.

Master control signal transmission buses 1h and 1m extend only up to the boundary regions with respect to memory arrays AR0 and AR1, respectively. Therefore, the lengths of master control signal transmission buses 1h and 1m are each ⅝ (½+⅜) the length 2•LA of chip CH along the longer side direction, the lengths of the buses are thus shortened, and therefore master control circuit MCTL can drive buses 1h and 1m at a high speed.

As described above, according to the second embodiment, the memory mat is divided into a plurality of arrays along the longer side of the chip, row related circuits are provided between adjacent arrays, internal signals from the master control circuit are transmitted through buffer circuits to these row related circuits, and therefore the row related signals can be transmitted at a high speed, thus enabling the high speed operation of the row related circuits. The length of a signal line to be driven by the row related circuits is shortened, and therefore a row selecting operation can be performed at a high speed which enables high speed accessing.

Third Embodiment

Figure 7:
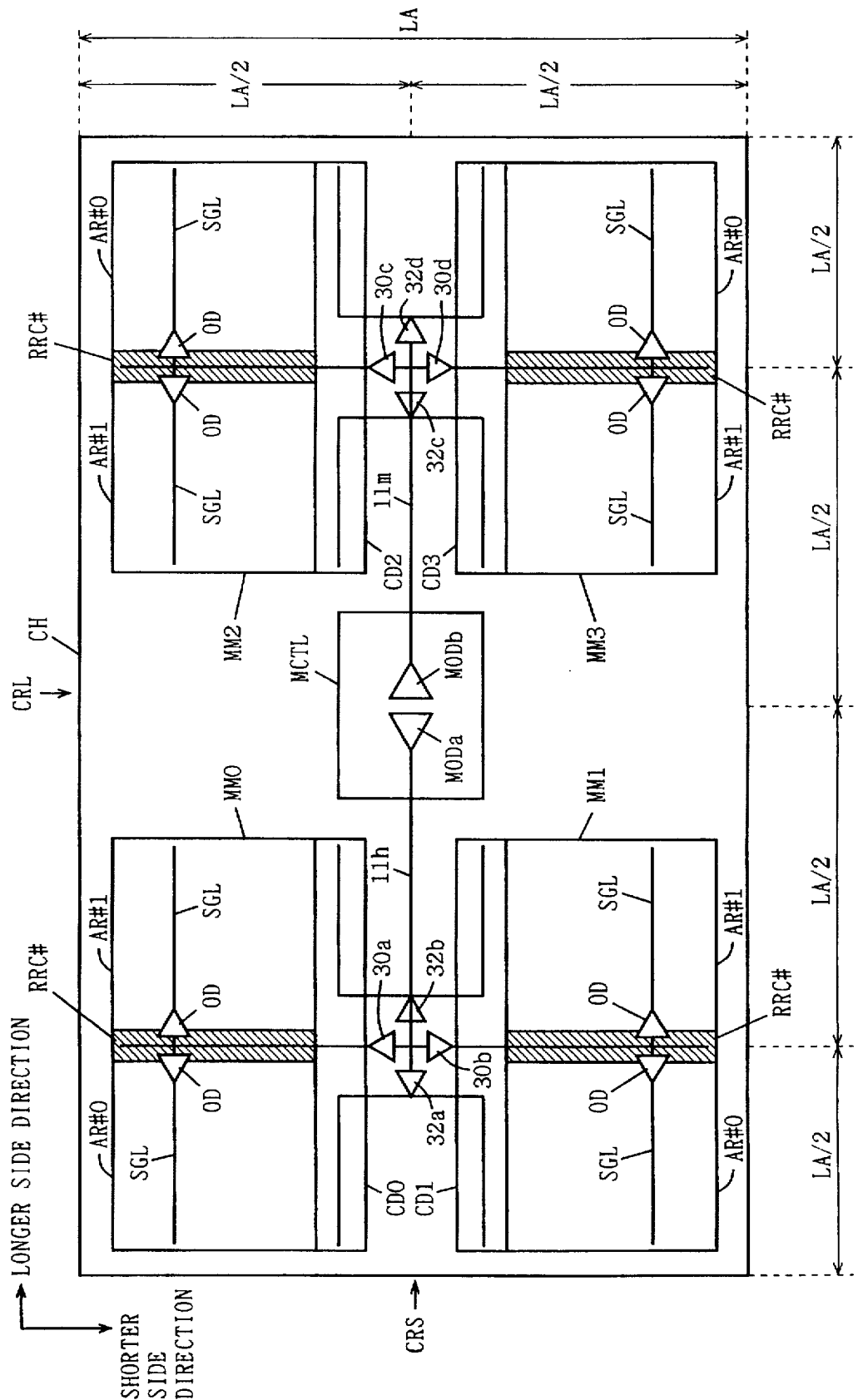
FIG. 7 is a diagram schematically showing the chip layout of a semiconductor memory device according to a third embodiment of the invention.

FIG. 7 is a diagram schematically showing the chip layout of a semiconductor memory device according to a third embodiment of the invention. Also in the configuration shown in FIG. 7, memory mats MM0 to MM3 are provided in four regions formed by dividing semiconductor chip CH by central regions CRS and CRL. Memory mats MM0 to MM3 are each divided into two memory arrays AR#0 and AR#1 along the longer side direction. In each of memory mats MM0 to MM3, a row related circuit RRC# is provided along the shorter side direction in the region between memory arrays AR#0 and AR#1.

In central region CRS, a master control signal transmission bus 11h is provided extending along the longer side direction up to the vicinity of the boundary between memory arrays AR#0 and AR#1 in memory mats MM0 and MM1 from master control circuit MCTL. In central region CRS, a master control signal transmission bus 11m is provided up to the vicinity of the boundary between memory arrays AR#0 and AR#1 in memory mats MM2 and MM3 along the longer side direction in the direction opposite to the extending of master control signal transmission bus 11h. Master control circuit MCTL drives master control signal transmission buses 11h and 11m using buffer circuits MODa and MODb as output drivers.

Corresponding to row related circuit RRC# in memory mats MM0 and MM1, buffer circuits 30a and 30b are provided. Buffer circuit 30a buffers an internal signal from master control signal transmission bus 11h for transmission to row related circuit RRC# in memory mat MM0. Buffer circuit 30b buffers an internal signal from master control signal transmission bus 11h for transmission to row related circuit RRC# in memory mat MM1.

Corresponding to master control signal transmission bus 11h, buffer circuits 32a and 32b are provided. Buffer circuit 32a buffers a column related signal from master control signal transmission bus 11h and transmits the buffered signal to portions provided corresponding to memory array AR#0 in column decoders CD0 and CD1 in memory mats MM0 and MM1. Buffer circuit 32b buffers a column related signal on master control signal transmission bus 11h and transmits the buffered signal to column decoder portions provided corresponding to memory array AR#1 in memory mats MM0 and MM1. Buffer circuits 32a and 32b transmit signals in the opposite directions, memory arrays AR#0 and AR#1 are equal in length in the longer side direction, and therefore buffer circuits 32a and 32b drive buses of the same length.

Corresponding to master control signal transmission bus 11m, buffer circuits 30c and 30d to buffer a row related signal are provided, buffer circuits 32d and 32e to buffer a column related signal are provided in the vicinity of buffer circuits 30c and 30d. Buffer circuits 30c transmits a buffered row related signal to row related circuit RRC# in memory mat MM2, and the buffered row related signal to row related circuit RRC# in memory mat MM3. Buffer circuit 32d transmits a buffered column related signal to the column decoder portion provided corresponding to memory array AR#0 in memory mats MM2 and MM3. Buffer circuits 32e transmits a buffered column related signal to the portions corresponding to memory array AR#1 in column decoders CD2 and CD3.

Column decoders CD0 to CD3 are positioned facing central region CRS among memory mats MM1 to MM3.

In the arrangement shown in FIG. 7, the length of a signal line SGL to be driven by output driver OD in row related circuit RRC# is about ½ the length of each of memory mats MM0 to MM3 in the longer side direction. The length of signal line SGL is almost the same as the length of each of memory mats MM0 to MM3 along the shorter side direction. Master control signal transmission buses 11h and 11m extend only up to the vicinity of the boundary between memory arrays AR#0 and AR#1. The length of master control signal transmission buses 11h and 11m are each about ½ the length of each of memory mats MM0 to MM3 along the longer side direction, and therefore signals can be transmitted at a higher speed than conventional cases. Row related circuit RRC# operates in response to a signal made definite at an earlier timing accordingly, and high speed accessing is achieved as a result.

For column related signals, master control signal transmission buses 11h and 11m have a length identical to those in the second embodiment, and column related signals can be transmitted to column decoders CD0 to CD3 at a high speed by the function of buffer circuits 32a and 32b.

The length of a column select signal transmission line from column decoders CD0 to CD3 is the length of corresponding one of memory mats MM0 to MM3 along the shorter side direction, and as is the second embodiment, a column select signal can be made definite at a high speed, and therefore high speed accessing is enabled.

As described above, according to the third embodiment of the invention, a memory mat is divided into two memory arrays along the longer side direction, and a row related circuit is provided between these arrays along the shorter side direction, the length of a master control signal transmission bus provided extending in the peripheral direction from the master control circuit is about ½ the length of a memory mat along the longer side direction, and therefore master control circuit can propagate signals at a high speed, thus enabling high speed accessing.

Fourth Embodiment

FIG. 8 is a diagram schematically showing the chip layout of a semiconductor memory device according to a fourth embodiment of the invention. In the arrangement shown in FIG. 8, as is the arrangement shown in FIG. 6, memory mats MM0 to MM3 are each divided into memory arrays AR0 to AR3. In this fourth embodiment, row decoders RRDa and RRDb are shown in place of row related circuits RRCa and RRCb in order to illustrate how an address signal propagates.

In central region CRS between memory mats MM0 and MM1, a master address signal transmission bus 1ha transmitting an internal address signal and a predecode signal is provided along the longer side direction from the master control circuit MCTL. Master address signal transmission bus 1ha is provided extending up to the vicinity of the boundary between memory arrays AR0 and AR1 in memory mats MM0 and MM1 from master control circuit MCTL. Similarly, in central region CRS between memory mats MM2 and MM3, a master address signal transmission bus 1ma transmitting an address signal and a predecode signal is provided extending along the longer side direction from master control circuit MCTL. Master address signal transmission bus 1ma is provided extending up to the vicinity of the boundary between memory arrays AR0 and AR1 in memory mats MM2 and MM3. As is the arrangement shown in FIG. 6, corresponding to bus 1ha, buffer circuits 20a–20d, 22a and 22b are provided, and corresponding to bus 1ma buffer circuits 20e–20h, 22c and 22d are provided.

Master control circuit MCTL includes a predecoder PD which predecodes an applied address signal (from an address input buffer), and drivers PVa and PVb which transmit the output signal of predecoder PD onto master address signal transmission buses 1ha and 1ma. In the configuration shown in FIG. 8, row decoders RRDa and RRDb do not fully decode all the applied internal address signal bits but the internal address signal is predecoded by predecoder PD in master control circuit MCTL, and the predecoded address signal is transmitted to row decoders RRDa and RRDb. Such a predecoding method is known to reduce the scale of a row decoder used.

Now, let us assume that the address signal has three bits for example. If the 3-bit address signal is transmitted as internal address signal bits, complimentary address signal bits must be transmitted, which requires six signal lines. Three signal lines among them are set to an H level and remaining three are set at an L level. Therefore, at least two signal lines among these six signal lines must be charged/discharged (only one bit address changes at minimum: usually three signal lines in dynamic driving). Meanwhile, according to the predecoding method, 8 signal lines are necessary, but only one signal line is activated, in other words the number of signal lines to be driven is reduced, leading to reduced current consumption (when the semiconductor memory device performs a dynamic operation, all the signal lines are precharged to a prescribed potential.) The use of the predecoded signal in the row decoder reduces signal bits to be decoded eventually, the structure of a unit decoder is reduced, and area increase may be restricted to the minimum level even if row decoders RRDa and RRDb are provided between memory arrays. Buffer circuits 20a–20h, 22a–22d are disposed in the same manner as in FIG. 6, and the predecode signal can be transmitted to each of row decoders RRDa–RRDd from predecoder PD at a high speed.

As described above, according to the fourth embodiment, the address signal is predecoded and transmitted to the memory mats and row decoders (included in the row related circuit), the address signal may be transmitted with reduced current consumption without greatly increasing the area occupied by lines, in addition to the effects brought about by the first to third embodiments. Furthermore, the scale of a row decoder can be restricted from increasing, and the area penalty associated with disposing the row decoder between arrays can be restricted to the minimum level accordingly.

Note that in the above descriptions the semiconductor memory device has an input pad disposed in the central region of the semiconductor chip along its shorter side direction. However, the present invention is also applicable to a so-called "peripheral pad" arrangement in which such a signal input pad is disposed along the periphery of the semiconductor chip as long as the peripheral circuitry is disposed in the central region along the longer side direction of the semiconductor chip and signals are transmitted from the peripheral control circuit to a control circuit (such as local control circuit and address decoder) in each memory mat.

In addition, the present invention is applicable to memory devices such as flash EEPROM (electrically erasable programmable nonvolatile memory) and static random access memory other than dynamic random access memory.

According to the present invention, buffers are provided corresponding to a plurality of memory mats and between a plurality of local control circuits which drive corresponding memory mats in response to an internal signal from a master control circuit, the internal signal can be transmitted at a high speed even if signal transmission lines between the master control circuit and the local control circuits are long, and therefore high speed accessing is enabled.

Furthermore, since row selecting circuitry is provided along the shorter side direction of the chip, and column selecting circuitry is provided along the longer side direction, the length of a column select signal transmission line to be driven by the column selecting circuitry is shortened, and therefore the column select signal can be transmitted at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
 a plurality of memory mats each having a plurality of memory cells arranged in rows and columns;
 a master control circuit coupled to receive and responsive to an externally applied signal including an address signal, for generating an internal address signal and an internal control signal commonly to said plurality of memory mats;

a plurality of local control circuits provided corresponding to each of the memory mats for controlling accessing to memory cells in corresponding memory mats based on the internal address signal and the internal control signal from said master control circuit; and buffer means provided between said master control circuit and each of the local control circuits for buffering a signal received from said master control circuit for transmission to each of said plurality of local control circuits.

2. The semiconductor memory device as recited in claim 1, wherein said semiconductor memory device is formed on a rectangular semiconductor chip having a first side and a second side longer than said first side, and wherein said plurality of local control circuits each include a sub local control circuit provided for a corresponding memory mat and in parallel with said first side, an output signal from said master control circuit is transmitted along an extending direction of said second side, and said buffer means includes a buffer circuit receiving a signal transmitted from said master control circuit along the direction of said second side for buffering the received signal for transmission to each said sub local control circuit along an extending direction of said first side.

3. The semiconductor memory device as recited in claim 2, wherein each of the memory mats is divided into a plurality of arrays along the direction of said second side, and said sub local control circuit is provided along the direction of said first side between adjacent arrays in a corresponding memory mat.

4. The semiconductor memory device as recited in claim 3, wherein each of the memory mats is divided into two arrays.

5. The semiconductor memory device as recited in claim 3, wherein each of the memory mats is divided into first to fourth four adjacent arrays, and said sub local control circuit is provided between said first and second arrays and between said third and fourth arrays in a corresponding memory mat.

6. The semiconductor memory device as recited in claim 2, wherein said sub local control circuit includes a row related circuit associated with a row selection to drive an addressed row of memory cells in a corresponding memory mat into a selected state.

7. The semiconductor memory device as recited in claim 2, wherein each said local control circuit further includes a column related circuit provided along the direction of said second side in a corresponding memory mat for selecting an addressed column of memory cells in said corresponding memory mat.

8. The semiconductor memory device as recited in claim 7, wherein said buffer means further includes a buffer provided corresponding to each of the memory mats for buffering a signal received from said master control circuit and transmitting the buffered signal in opposite directions from each other along the direction of said second side for application to a corresponding column related circuit.

9. A semiconductor memory device formed on a rectangular semiconductor chip having a first side and a second side longer than said first side, comprising:

a plurality of memory mats, each having a shorter side in the first side direction and a longer side in the second side direction longer than said shorter side and having a plurality of memory cells arranged in rows and columns, said plurality of memory mats being provided in four regions of said rectangular semiconductor chip, respectively, said semiconductor chip being divided by a central portion in each of the first and second sides into said four regions;

row selecting means provided along said shorter side of each respective memory mat for driving a row addressed by a first address signal into a selected state in a corresponding memory mat, and column selecting means provided along said longer side of each respective memory mat for selecting a column addressed by a second address signal in a corresponding memory mat.

10. The semiconductor memory device as recited in claim 9, wherein said column selecting means is provided in a corresponding memory mat facing the central portion for said first side.

11. A semiconductor memory device formed on a rectangular semiconductor chip having a first side and a second side longer that said first side, said semiconductor memory device comprising:

a plurality of memory mats, each having a shorter side in the first side direction and a longer side in the second side direction longer than said shorter side and having a plurality of memory cells arranged in rows and columns, said plurality of memory mats being provided in four regions of said rectangular semiconductor chip, respectively, said semiconductor chip being divided by a central portion in each of the first and second sides into said four regions;

row selecting means provided alone said shorter side of each of said memory mats for providing a row addressed by a first address signal into a selected state;

column selecting means provided in a corresponding memory mat along said longer side of said corresponding memory mat and facing the central portion for said first side for selecting a column addressed by a second address signal;

a master control circuit provided in a central region for both said first and second sides of said semiconductor chip for generating an internal signal commonly to the memory mat in each of the four regions in accordance with an externally applied signal including an address signal and transmitting the generated signal through the central portion for said first side along said second side direction, and buffer means provided corresponding to each of the memory mats for buffering the signal received from said master control circuit and transmitting the buffered signal to the row selecting means in corresponding memory mat.

12. The semiconductor memory device as recited in claim 10, wherein each of the memory mats is divided in said second side direction into a plurality of arrays each having a plurality of memory cells arranged in rows and columns, and said row selecting means is provided between adjacent arrays in a corresponding memory mat.

13. The semiconductor memory device as recited in claim 12, wherein each of the memory mats is divided into two arrays.

14. The semiconductor memory device as recited in claim 12, wherein each of the memory mats is divided into first to fourth arrays along said second side direction, and said row selecting means is provided between said first and second arrays and between said third and fourth arrays.

15. The semiconductor memory device as recited in claim 11, further comprising column buffer means provided corresponding to each of the memory mats for buffering a signal associated with a column selection from said master control circuit for transmission to column selecting means in a corresponding memory mat.

16. The semiconductor memory device as recited in claim 15, wherein said column buffer means includes means provided in a central portion with respect to said second side direction in a corresponding memory mat for transmitting a buffered signal in opposite directions to each other.

17. The semiconductor memory device as recited in claim 11, wherein said master control circuit includes predecode means provided corresponding to the memory mats for predecoding an internal address signal generated in said master control circuit and transmitting the predecoded signal to said buffer means along said second side direction.

18. The semiconductor memory device as recited in claim 15, wherein said master control circuit includes predecode means provided for the memory mats for predecoding an internal address signal generated in said master control circuit in accordance with said address signal for transmission to the column buffer means along the second side direction.

19. The semiconductor memory device according to claim 1, wherein said buffer means comprises a drive circuit receiving the signal from the master control circuit for driving an output node thereof to a voltage level corresponding to the received signal.

20. The semiconductor memory device according to claim 1, wherein the signal from the master control circuit is at least one of said internal address signal and said internal control signal.

* * * * *

UNITED STATES PATENT AND TRADEMARK OFFICE
CERTIFICATE OF CORRECTION

PATENT NO. : 5,894,448
DATED : April 13, 1999
INVENTOR(S) : Teruhiko AMANO, et al It is certified that error appears in the above-identified patent and that said Letters Patent is hereby corrected as shown below:

In the Claims, claim 11, line 3, change "that" to --than--; and line 14, change "providing" to --driving--

Signed and Sealed this

Nineteenth Day of October, 1999

Attest:

Q. TODD DICKINSON

Attesting Officer

Acting Commissioner of Patents and Trademarks